US009992442B2

(12) United States Patent
Aoki et al.

(10) Patent No.: US 9,992,442 B2
(45) Date of Patent: Jun. 5, 2018

(54) DECODER, RECEIVER, AND ELECTRONIC DEVICE

(71) Applicant: Semiconductor Energy Laboratory Co., Ltd., Atsugi-shi, Kanagawa-ken (JP)

(72) Inventors: Takeshi Aoki, Kanagawa (JP); Munehiro Kozuma, Kanagawa (JP); Yoshiyuki Kurokawa, Kanagawa (JP)

(73) Assignee: Semiconductor Energy Laboratory Co., Ltd., Atsugi-shi, Kanagawa-ken (JP)

( * ) Notice: Subject to any disclaimer, the term of this patent is extended or adjusted under 35 U.S.C. 154(b) by 0 days. days.

(21) Appl. No.: 15/729,169

(22) Filed: Oct. 10, 2017

(65) Prior Publication Data

US 2018/0109752 A1   Apr. 19, 2018

(30) Foreign Application Priority Data

Oct. 13, 2016   (JP) ................................ 2016-202007

(51) Int. Cl.
| H04N 5/455 | (2006.01) |
| H03M 99/00 | (2006.01) |
| G11C 14/00 | (2006.01) |

(52) U.S. Cl.
CPC ......... *H04N 5/455* (2013.01); *G11C 14/0072* (2013.01); *H03M 99/00* (2013.01)

(58) Field of Classification Search
CPC ......... G11C 7/08; G11C 7/06; G11C 14/0072; H03M 99/00; H04N 5/455
USPC ............................. 341/99; 365/149, 154, 205
See application file for complete search history.

(56) References Cited

U.S. PATENT DOCUMENTS

| 8,410,838 B2 * | 4/2013 | Kato ........................ G11C 7/04 327/215 |
| 9,064,574 B2 * | 6/2015 | Aoki .................. G11C 14/0072 |
| 2011/0101339 A1 | 5/2011 | Yamazaki et al. |
| 2012/0293202 A1 | 11/2012 | Nishijima et al. |
| 2014/0126271 A1 | 5/2014 | Aoki et al. |
| 2014/0374747 A1 | 12/2014 | Kurokawa |

OTHER PUBLICATIONS

Kawashima.S et al., "13.3-in. 8K×4K 664-ppi OLED Display Using CAAC-OS FETs", SID Digest '14 : SID International Symposium Digest of Technical Papers, Jun. 3, 2014, pp. 627-630.

* cited by examiner

*Primary Examiner* — Khai M Nguyen
(74) *Attorney, Agent, or Firm* — Fish & Richardson P.C.

(57) ABSTRACT

A decoder with reduced power consumption is provided. The decoder includes a first circuit and a second circuit for holding data. The second circuit includes a first transistor, a second transistor, and a third transistor. The first transistor and the second transistor include an oxide semiconductor in a channel formation region. The third transistor includes silicon in a channel formation region. A gate of the second transistor is electrically connected to one of a source and a drain of the first transistor and a gate of the third transistor is electrically connected to one of a source and a drain of the second transistor. The decoder is configured to provide or stop power supply to the semiconductor device depending on a packet ID of a header portion of the data and to perform data storing or restoring of data between the first circuit and the second circuit.

12 Claims, 29 Drawing Sheets

DECODER, RECEIVER, AND ELECTRONIC DEVICE

BACKGROUND OF THE INVENTION

1. Field of the Invention

One embodiment of the present invention relates to a decoder, a receiver, and an electronic device.

Note that one embodiment of the present invention is not limited to the above technical field. The technical field of one embodiment of the invention disclosed in this specification and the like relates to an object, a method, or a manufacturing method. In addition, one embodiment of the present invention relates to a process, a machine, manufacture, or a composition of matter. Specifically, examples of the technical field of one embodiment of the present invention disclosed in this specification include a semiconductor device, a display device, a liquid crystal display device, a light-emitting device, a lighting device, a power storage device, a storage device, an imaging device, a method for driving any of them, and a method for manufacturing any of them.

2. Description of the Related Art

As a screen of a television (TV) becomes larger, it is desired to be able to watch a high-definition image. For this reason, ultra-high definition TV (UHDTV) broadcast has been increasingly put into practical use. In Japan, 4K broadcast service utilizing a communication satellite (CS) and an optical line are started in 2015. The test broadcast of UHDTV (4K and 8K) by a broadcast satellite (BS) will start in the future. Therefore, various electronic devices which correspond to 8K broadcast are developed (e.g., Non-Patent Document 1). In practical 8K broadcasts, 4K broadcasts and 2K broadcasts (full-high vision broadcast) will be also employed.

Data transmission of the current digital television broadcast using a broadcast satellite (BS), a communication satellite (CS), or the like utilizes transport stream (also referred to as TS or MPEG TS) which is a method for multiplexing and transmitting compressed data by an encoding method such as MPEG-2. Data to be transmitted by TS has a structure in which types of data such as encoded video data, encoded audio data, encoded load data, encoded control signal, and the like is multiplexed. The data to be transmitted by TS is transmitted on a per packet (referred to as a TS packet) basis.

REFERENCE

[Non-Patent Document] S. Kawashima et al., "13.3-in. 8K×4K 664-ppi OLED Display Using CAAC-OS FETs," SID 2014 DIGEST, pp. 627-630.

SUMMARY OF THE INVENTION

The amount of data transmitted as a TS packet is largely changed by original data such as video data, audio data, or the like before multiplexing. Thus, data whose payload is empty and which is referred to as a null packet is transmitted between the packets including necessary data, so that transmission bit rate is adjusted.

However, the above-described null packet is processed by the same circuit as the packet including the payload in a decoder (a decoding circuit) that decodes data transmitted as a TS packet. Thus, the decoder consumes power even during the period when data to be decoded does not exist.

An object of one embodiment of the present invention is to reduce power consumption or to provide a novel decoder, a novel receiver, and a novel electronic device.

Note that the objects of one embodiment of the present invention are not limited to the above objects. The objects described above do not disturb the existence of other objects. The other objects are the ones that are not described above and will be described below. The other objects will be apparent from and can be derived from the description of the specification, the drawings, and the like by those skilled in the art. One embodiment of the present invention is to solve at least one of the aforementioned objects and the other objects.

One embodiment of the present invention is a decoder configured to decode data and the decoder includes a semiconductor device. The semiconductor device includes a first circuit and a second circuit for holding the data. The first circuit is configured to hold the data while power supply voltage is supplied. The second circuit is configured to hold the data while power supply voltage is not supplied. The second circuit includes a first transistor, a second transistor, and a third transistor. The first transistor and the second transistor include an oxide semiconductor in a channel formation region. The third transistor includes silicon in a channel formation region. A gate of the second transistor is electrically connected to one of a source and a drain of the first transistor. A gate of the third transistor is electrically connected to one of a source and a drain of the second transistor. The decoder is configured to provide or stop power supply to the semiconductor device depending on an identifier of a header portion of the data and to perform data storing or restoring of data between the first circuit and the second circuit.

One embodiment of the present invention is preferably the decoder to which the data is transmitted in packets including a data structure of a transport stream.

One embodiment of the present invention is a receiver configured to receive a broadcast signal and the receiver including a demodulator and the decoder described above. The demodulator is configured to demodulate the broadcast signal. The decoder processes the demodulated broadcast signal.

One embodiment of the present invention is an electronic device comprising a display portion and the receiver described above.

Note that other embodiments of the present invention will be described in the following embodiments with reference to the drawings.

One embodiment of the present invention can reduce power consumption or provide a novel decoder, a novel receiver, and a novel electronic device.

Note that the effects of one embodiment of the present invention are not limited to the above effects. The effects described above do not disturb the existence of other effects. The other effects are the ones that are not described above and will be described below. The other effects will be apparent from and can be derived from the description of the specification, the drawings, and the like by those skilled in the art. One embodiment of the present invention is to have at least one of the aforementioned effects and the other effects. Accordingly, one embodiment of the present invention does not have the aforementioned effects in some cases.

DETAILED DESCRIPTION OF THE INVENTION

Figure 1:
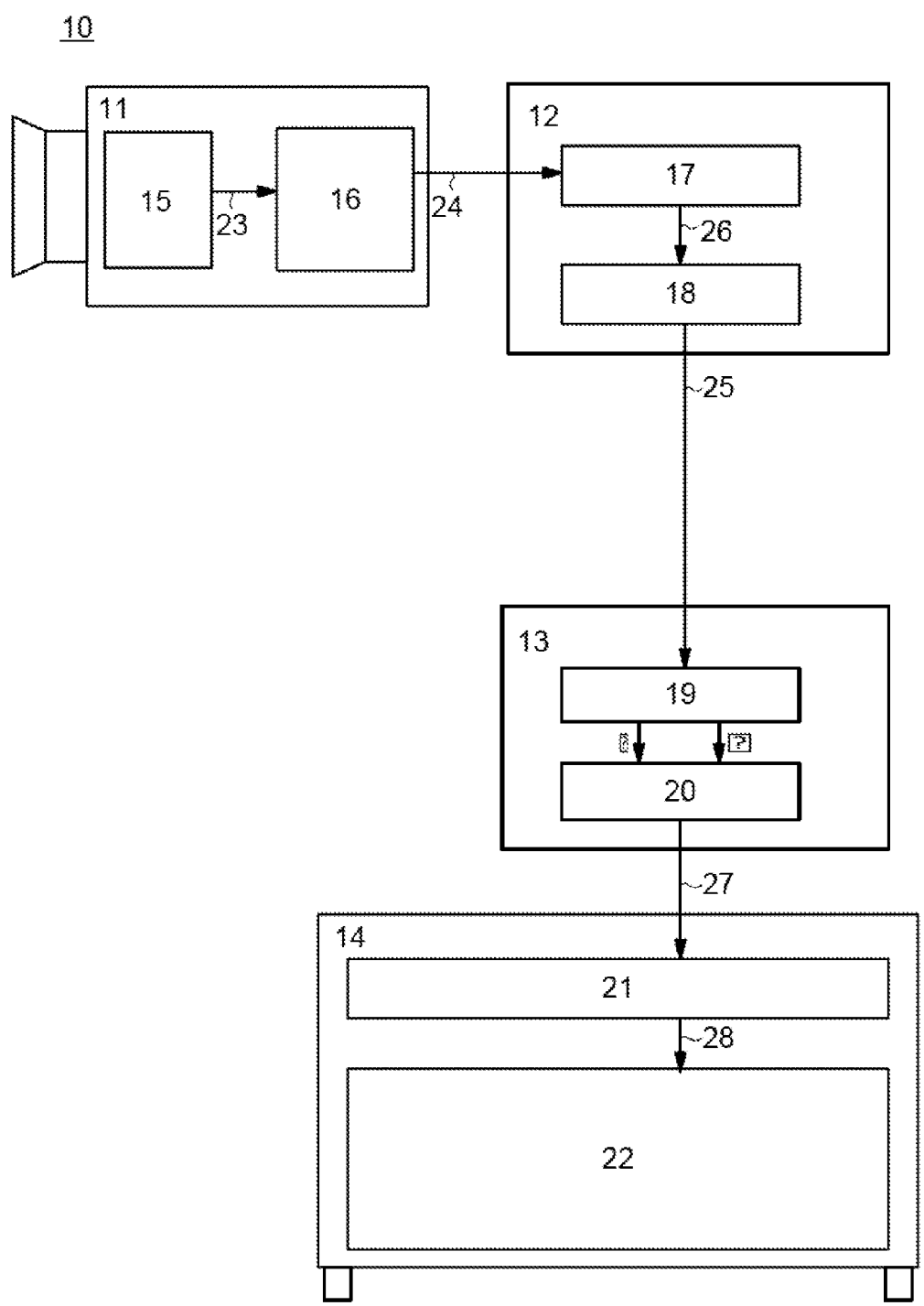
FIG. 1 is a block diagram illustrating a structure example of a broadcast system.

Hereinafter, embodiments will be described with reference to drawings. However, the embodiments can be implemented with various modes. It will be readily appreciated by those skilled in the art that modes and details can be changed in various ways without departing from the spirit and scope of the present invention. Thus, the present invention should not be interpreted as being limited to the following description of the embodiments.

In this specification and the like, ordinal numbers such as first, second, and third are used in order to avoid confusion among components. Thus, the terms do not limit the number or order of components.

The same elements or elements having similar functions, elements formed using the same material, elements formed at the same time, or the like in the drawings are denoted by the same reference numerals, and the description thereof is not repeated in some cases.

Embodiment 1

<Broadcast System>

FIG. 1 is a block diagram schematically illustrating a configuration example of a broadcast system. A broadcast system 10 includes a camera 11, a transmitter 12, a receiver 13, and a display device 14. The camera 11 includes an image sensor 15 and an image processor 16. The transmitter 12 includes an encoder 17 and a modulator 18. The receiver 13 includes a demodulator 19 and a decoder 20. The display device 14 includes an image processor 21 and a display portion 22.

When the camera 11 is capable of taking an 8K image, the number of pixels included in the image sensor 15 corresponds to the number of pixels that can capture an 8K color image. For example, when each pixel includes one red (R) subpixel, two green (G) subpixels, and one blue (B) subpixel, the image sensor 15 needs at least 7680×4320×4 [R, G+G, and B] sub pixels.

The image sensor 15 generates raw data 23 which has not been processed. The image processor 16 performs image processing (e.g., noise removal or interpolation) on the raw data 23 and generates video data 24. The video data 24 is output to the transmitter 12.

The transmitter 12 processes the video data 24 and generates a broadcast signal (carrier wave) 25 that accords with a broadcast band. The encoder 17 processes the video data 24 and generates encoded data 26. The encoder 17 performs processing such as encoding of the video data 24, addition of broadcast control data (e.g., authentication data) to the video data 24, encryption, or scrambling (data rearrangement for spread spectrum).

The modulator 18 performs IQ modulation (quadrature amplitude modulation) on the encoded data 26 to generate and output the broadcast signal 25. The broadcast signal 25 is a composite signal including data on an I (identical phase) component and a Q (quadrature phase) component. A TV broadcast station plays a role in obtaining the video data 24 and supplying the broadcast signal 25.

The receiver 13 receives the broadcast signal 25. The receiver 13 has a function of converting the broadcast signal 25 into video data 27 that can be displayed on the display device 14. The demodulator 19 demodulates the broadcast signal 25 and decomposes it into two analog signals: an I signal and a Q signal.

The decoder 20 has a function of converting the I signal and the Q signal into a digital signal. Moreover, the decoder 20 executes various processing on the digital signal and generates a data stream. This processing includes frame separation, decryption of a low density parity check (LDPC) code, separation of broadcast control data, descrambling, and the like. The decoder 20 decodes the data stream and generates the video data 27. The processing for decryption includes quadrature transform such as discrete cosine transform (DCT) and discrete sine transform (DST), inter-frame prediction processing, and motion compensation prediction processing.

The video data 27 is input to the image processor 21 of the display device 14. The image processor 21 processes the video data 27 and generates a data signal 28 that can be input to the display portion 22. Examples of the processing by the image processor 21 include image processing (gamma processing) and digital-analog conversion. When receiving the data signal 28, the display portion 22 displays an image.

Figure 2:
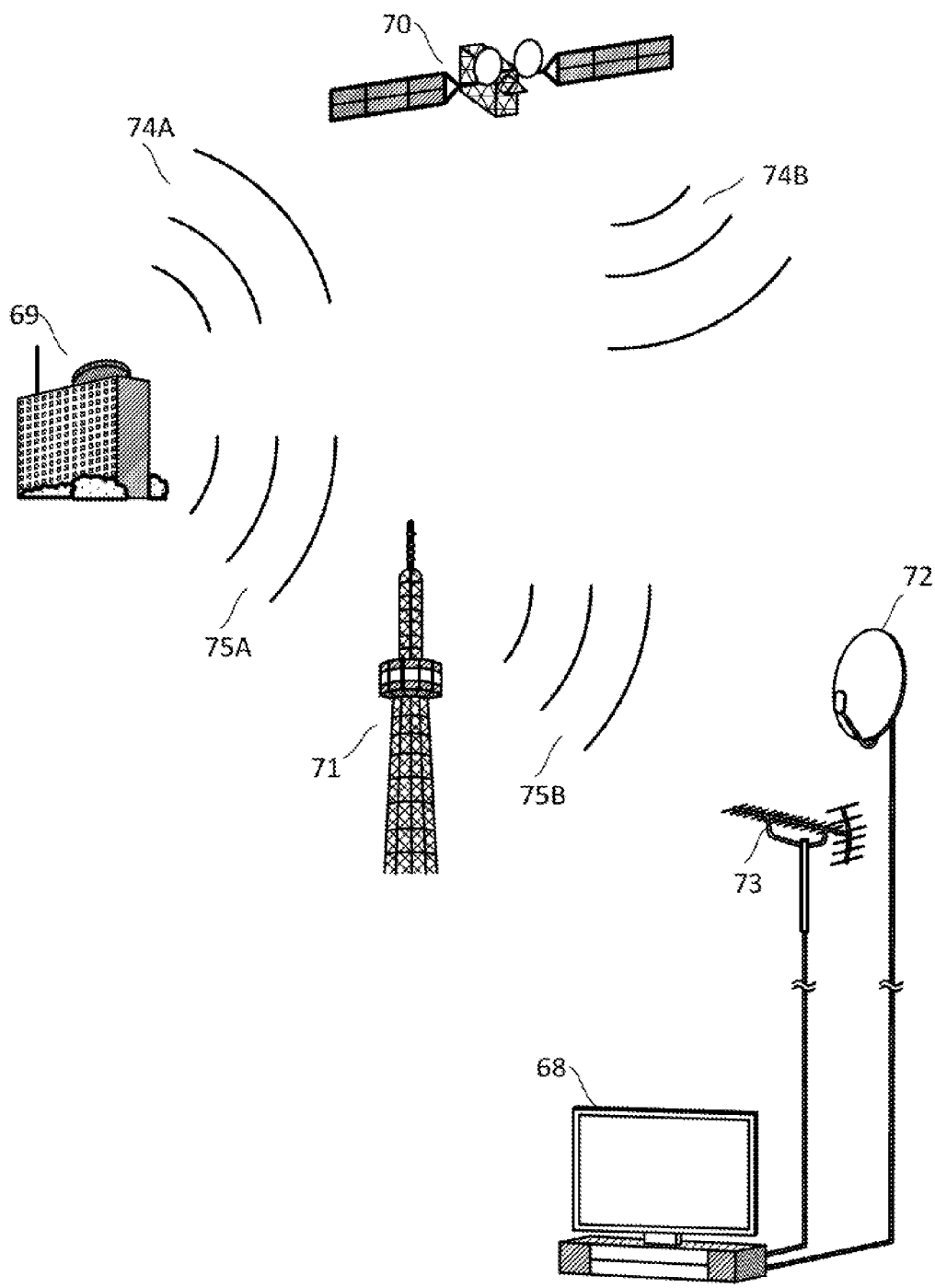
FIG. 2 is a schematic view illustrating data transmission in a broadcast system.

FIG. 2 schematically illustrates data transmission in the broadcast system. FIG. 2 illustrates a path in which a radio wave (a broadcast signal) transmitted from a broadcast station 69 is delivered to a television receiver 68 (a TV 68) of every household. The TV 68 is provided with the receiver 13 and the display device 14 illustrated in FIG. 1. As examples of an artificial satellite 70, a communication satellite (CS) and a broadcast satellite (BS) can be given. As examples of an antenna 72, a BS∩110° CS antenna and a CS antenna can be given. As examples of an antenna 73, ultra high frequency (UHF) antenna can be given.

Radio waves 74A and 74B are broadcast signals for a satellite broadcast. The artificial satellite 70 transmits the radio wave 74B toward the ground when receiving the radio wave 74A. The antenna 72 of every household receives the radio wave 74B, and a satellite TV broadcast can be watched on the TV 68. Alternatively, the radio wave 74B is received by an antenna of another broadcast station, and a receiver in the broadcast station processes the radio wave 74B into a signal that can be transmitted to an optical cable. The broadcast station transmits the broadcast signal to the TV 68 of every household using an optical cable network. Radio waves 75A and 75B are broadcast signals for a terrestrial broadcast. A radio wave tower 71 amplifies the received radio wave 75A and transmits it as the radio wave 75B. A terrestrial TV broadcast can be watched on the TV 68 of every household when the antenna 73 receives the radio wave 75B.

An image distribution system of this embodiment is not limited to a system for a TV broadcast. Image data to be distributed may be either moving image data or still image data.

Figure 3A:
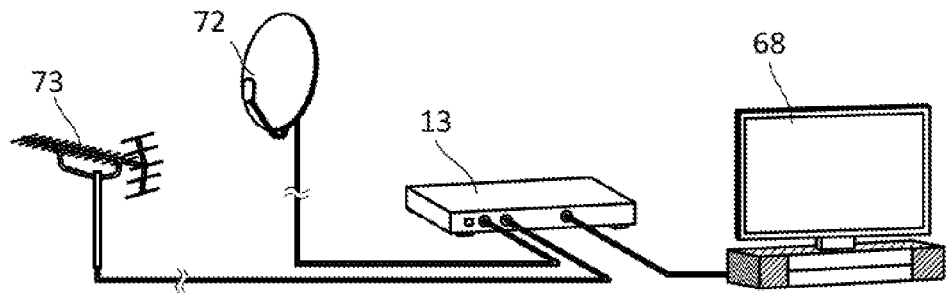
FIGS. 3A to 3D illustrate structure examples of a receiver.
Figure 3B:
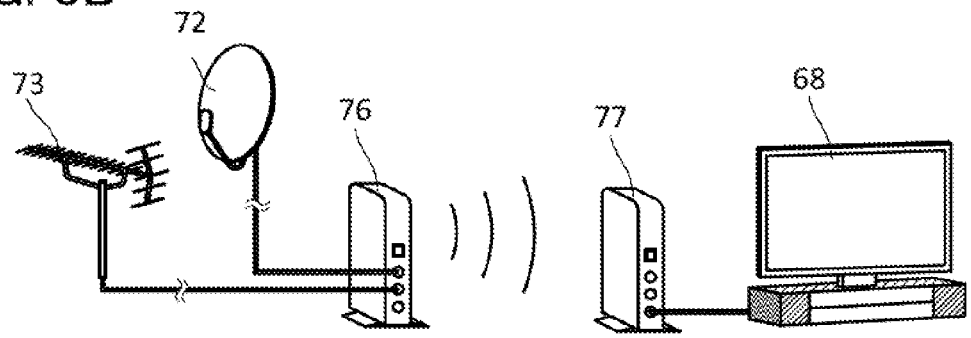
Figure 3C:
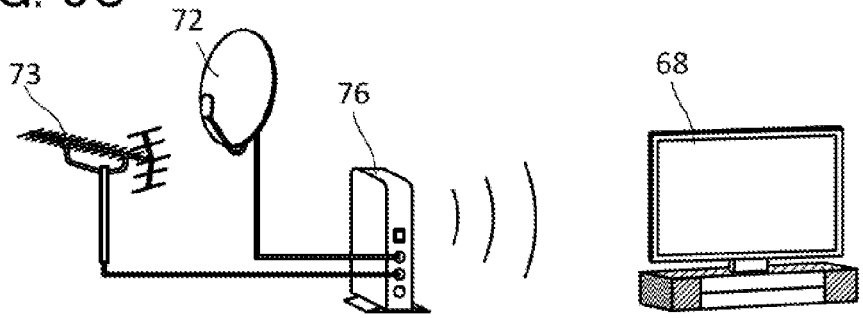
Figure 3D:
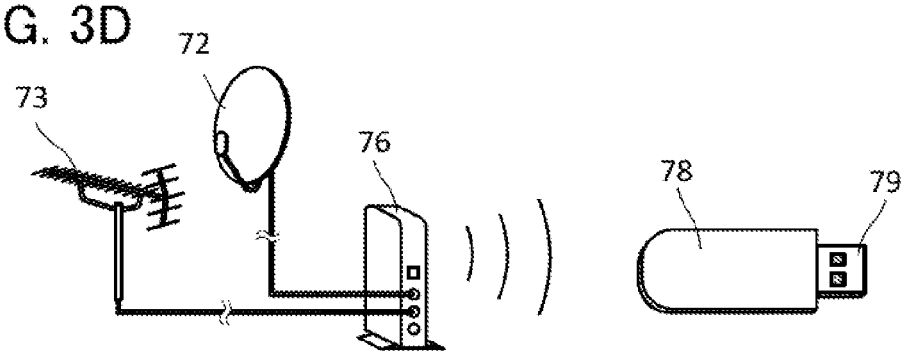

FIG. 2 illustrates an example in which a receiver is incorporated in the TV 68. It is possible to receive the radio waves by a receiver independent of the TV 68 to be displayed on the TV 68. Such examples are illustrated in FIGS. 3A to 3D. A receiver 13 may be provided outside the TV 68 (FIG. 3A). Data may be transmitted and received between the antennas 72 and 73 and the TV 68 via wireless devices 76 and 77 (FIG. 3B). In this case, the wireless device 76 or 77 functions as a receiver. The wireless device 77 may be incorporated in the TV 68 (FIG. 3C).

The size of a receiver can be reduced so that it can be portable. A receiver 78 illustrated in FIG. 3D includes a connector portion 79. If a display device and an electronic device such as an information terminal (e.g., a personal computer, a smartphone, a mobile phone, or a tablet terminal) include a terminal capable of being connected to the connector portion 79, they can be used to watch a satellite broadcast or a terrestrial broadcast.

In the broadcast system 10 in FIG. 1, the decoder 20 can be combined with dedicated IC or processor (e.g., GPU or CPU), for example. Furthermore, the decoder 20 includes a register with a flip-flop which temporarily stores data and a data retention circuit which holds data even when power supply is stopped. In the decoder including the register, the power supply to the decoder is stopped after storing data of the flip-flop in the data retention circuit and the data stored in the data retention circuit can be restored to the flip-flop.

It is effective to use a data retention circuit which utilizes extremely low leakage current in an off state (off current) of the transistor (hereinafter referred to as an OS transistor) including an oxide semiconductor in a channel formation region as the data retention circuit capable of holding stored data even when power supply to the decoder is stopped. A node performing data retention (charge retention) utilizes a gate node of the OS transistor.

Such a structure stores data from the flip-flop in the decoder 20 when the packet is recognized as a null packet from header data. When distinguishing the first packet including the payload after the null packet, power supply of the decoder 20 is resumed, so that the stored data can be restored to the flip-flop.

By having the above-described structure of the decoder, time needed for storing data and restoring data can be shorter than in the case where data is stored and restored by using an external nonvolatile memory. Thus, power consumption can be reduced. In addition, by using the gate node of the OS transistor in the circuit which stores data from the flip-flop, leakage current is suppressed by the gate insulating film of the OS transistor, so that charge can be held for a long time.

<Structure of Register>

Figure 4:
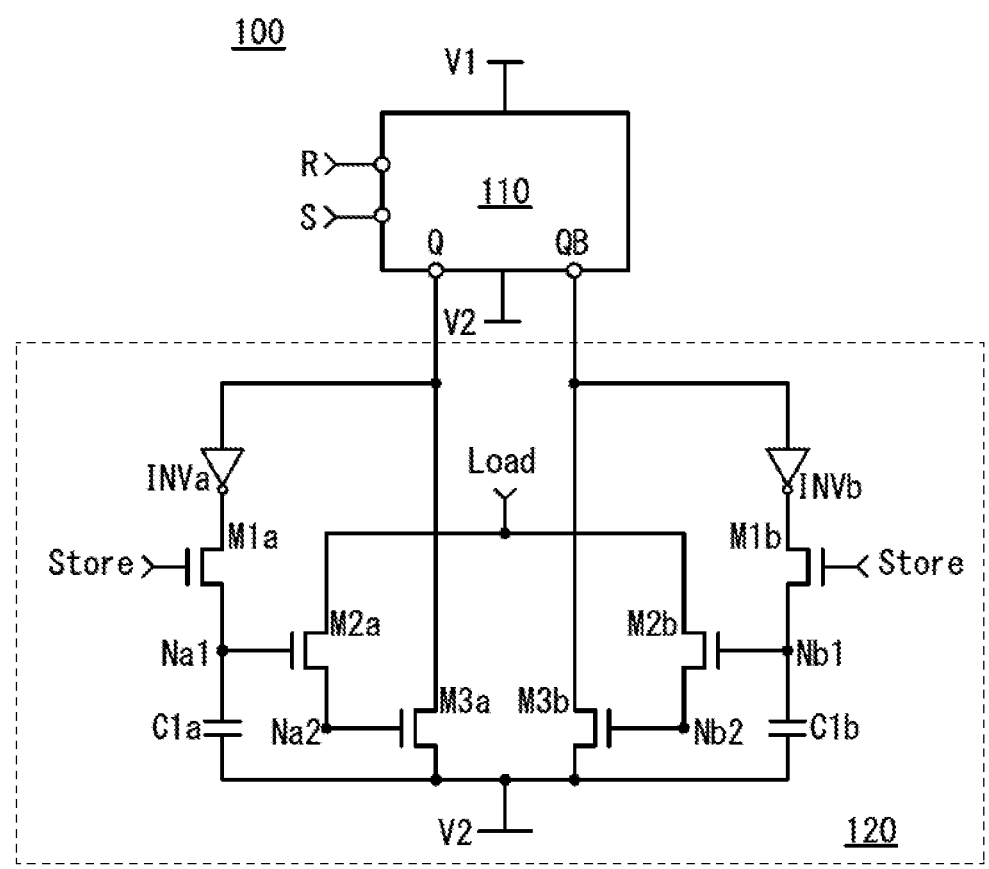
FIG. 4 is a circuit diagram for describing a semiconductor device.

FIG. 4 is a circuit diagram illustrating a structure of a semiconductor device which functions as the register which can be applied to the above-described decoder. The semiconductor device 100 includes a circuit 110 and a circuit 120.

The circuit 110 has a function of storing data while power supply voltage is supplied. The circuit 120 has a function of storing data even while power supply voltage is not supplied.

The circuit 110 is a circuit of a flip-flop, for example. FIG. 4 illustrates an SR type latch including the flip-flop as the circuit 110 and shows an input terminal R, an input terminal S, an output terminal Q, and an output terminal QB.

The circuit 120 is composed of a combination of a transistor containing an oxide semiconductor in its channel formation region (OS transistor) and a transistor containing silicon in its channel formation region (Si transistor), and stores data by holding charge corresponding to data with the use of the transistor having low off-state current.

Note that in the following description, data '1' refers to a voltage $V_{DD}$ (a high-level voltage or simply a high level). In other words, holding the data '1' refers to holding charge corresponding to the voltage $V_{DD}$. In contrast, data '0' refers to a voltage $V_{SS}$ (a low-level voltage or simply a low level). In other words, holding the data '0' refers to holding charge corresponding to the voltage $V_{SS}$.

Supply of power supply voltage can be controlled by switching voltage V1 and voltage V2. For example, power supply voltage is provided when the voltage V1 is set to the voltage $V_{DD}$ and the voltage V2 is set to the voltage $V_{SS}$. Power supply voltage is not supplied when the voltage V1 and the voltage V2 are set to the same voltages (e.g., the voltage V1 and the voltage V2 are set to the voltage $V_{SS}$).

Next, the circuit 120 in one embodiment of the present invention will be described. The circuit 120 has a function of storing data of the output terminals Q and QB before the supply of power supply voltage to the circuit 110 is stopped, and holding the data. The circuit 120 also has a function of restoring the held data to the output terminals Q and QB of the circuit 110 after the supply of power supply voltage is restarted.

The circuit 120 includes an inverter INVa, a transistor M1a, a transistor M2a, a transistor M3a, and a capacitor C1a to store and restore data of the output terminal Q. Moreover, the circuit 120 includes an inverter INVb, a transistor M1b, a transistor M2b, a transistor M3b, and a capacitor C1b to store and restore data of the output terminal QB.

Although all the transistors are n-channel transistors in the following description, a p-channel transistor may be used alternatively.

An input terminal of an inverter INVa is connected to the output terminal Q. An output terminal of the inverter INVa is connected to one of a source and a drain of the transistor M1a. The other of the source and the drain of the transistor M1a is connected to a node Na1. A gate of the transistor M1a is supplied with a control signal Store. The node Na1 is connected to the other of the source and the drain of the transistor M1a, a gate of the transistor M2a, and one electrode of the capacitor C1a. One of a source and a drain of the transistor M2a is supplied with a control signal Load. The other of the source and the drain of the transistor M2a is connected to a node Na2. The node Na2 is connected to the other of the source and the drain of the transistor M2a and a gate of the transistor M3a. One of a source and a drain of the transistor M3a is connected to the output terminal Q. The other of the source and the drain of the transistor M3a is supplied with the voltage V2, that is, the voltage $V_{SS}$. The other electrode of the capacitor C1a is supplied with the voltage V2, that is, the voltage $V_{SS}$.

An input terminal of the inverter INVb is connected to the output terminal QB. An output terminal of the inverter INVb is connected to one of a source and a drain of the transistor M1b. The other of the source and the drain of the transistor M1b is connected to a node Nb1. A gate of the transistor M1b is supplied with the control signal Store. The node Nb1 is connected to the other of the source and the drain of the transistor M1b, a gate of the transistor M2b, and one electrode of the capacitor C1b. One of a source and a drain of the transistor M2b is supplied with the control signal Load. The other of the source and the drain of the transistor M2b is connected to a node Nb2. The node Nb2 is connected to the other of the source and the drain of the transistor M2b and a gate of the transistor M3b. One of a source and a drain of the transistor M3b is connected to the output terminal QB. The other of the source and the drain of the transistor M3b is supplied with the voltage V2, that is, the voltage $V_{SS}$. The other electrode of the capacitor C1b is supplied with the voltage V2, that is, the voltage $V_{SS}$.

The inverters INVa and INVb are provided to output signals with inverted logic of data of the output terminals Q and QB, respectively. This structure is employed to invert data of the output terminals Q and QB in advance and store the inverted data, because there is an inverse relation between the stored data and the restored data in operations of data storing and restoring between the circuit 110 and the circuit 120. The inverters INVa and INVb can be omitted if data is inverted, stored, and restored in a different manner. Furthermore, the inverters INVa and INVb can be provided as buffers for increasing the charge supply capability of the output terminals Q and QB.

The control signal Store is a signal for controlling the on/off state of the transistors M1a and M1b. Here, the transistors M1a and M1b are turned on with a high-level signal and are turned off with a low-level signal.

As the transistors M1a and M1b, a transistor with ultralow off-state current, such as an OS transistor, is used. Accordingly, voltages corresponding to data stored at the nodes Na1 and Nb1 can be held while the transistors M1a and M1b are off.

The capacitors C1a and C1b are provided to hold voltages corresponding to data stored at the nodes Na1 and Nb1. Note that the capacitors C1a and C1b can be omitted when the gate capacitance or the like of the transistors M2a and M2b is made large.

As the transistors M3a and M3b, a Si transistor, which has higher driving capability than an OS transistor, is used. To have higher driving capability, a Si transistor includes a thinner gate insulating film than an OS transistor. Accordingly, the amount of current flowing through the transistors M3a and M3b can be varied rapidly in accordance with the change in voltage of the nodes Na2 and Nb2.

As the transistors M2a and M2b, an OS transistor that includes a thicker gate insulating film than a Si transistor is used.

The control signal Load is a signal for varying the amount of current flowing through the transistors M3a and M3b in accordance with the voltages corresponding to data stored at the nodes Na1 and Nb1. For example, when the node Na1 is at high level and the control signal Load is at high level, the transistor M2a is turned on and the voltage of the node Na2 increases, so that the amount of current flowing through the transistor M3a increases. As another example, when the node Nb1 is at low level and the control signal Load is at high level, the transistor M2b is turned off and the voltage of the node Nb2 does not change; thus, the amount of current flowing through the transistor M3b does not change. By using the difference in voltage of the output terminals Q and QB caused by the difference in the amount of current flowing through the transistors M3a and M3b, data can be restored to the circuit 110.

In one embodiment of the present invention, gate insulating films of the transistors M2a and M2b connected to the nodes Na1 and Nb1, which correspond to the nodes for holding data, can be formed thick regardless of Si transistor scaling laws. Thus, the data retention time can be increased. Alternatively, in one embodiment of the present invention, data can be stored and restored between the circuit 110 and the circuit 120 in response to stop and restart of supply of power supply voltage. Consequently, lower power consumption due to stop of supply of power supply voltage can be achieved while data is held properly.

<Operation of Register>

Figure 5:
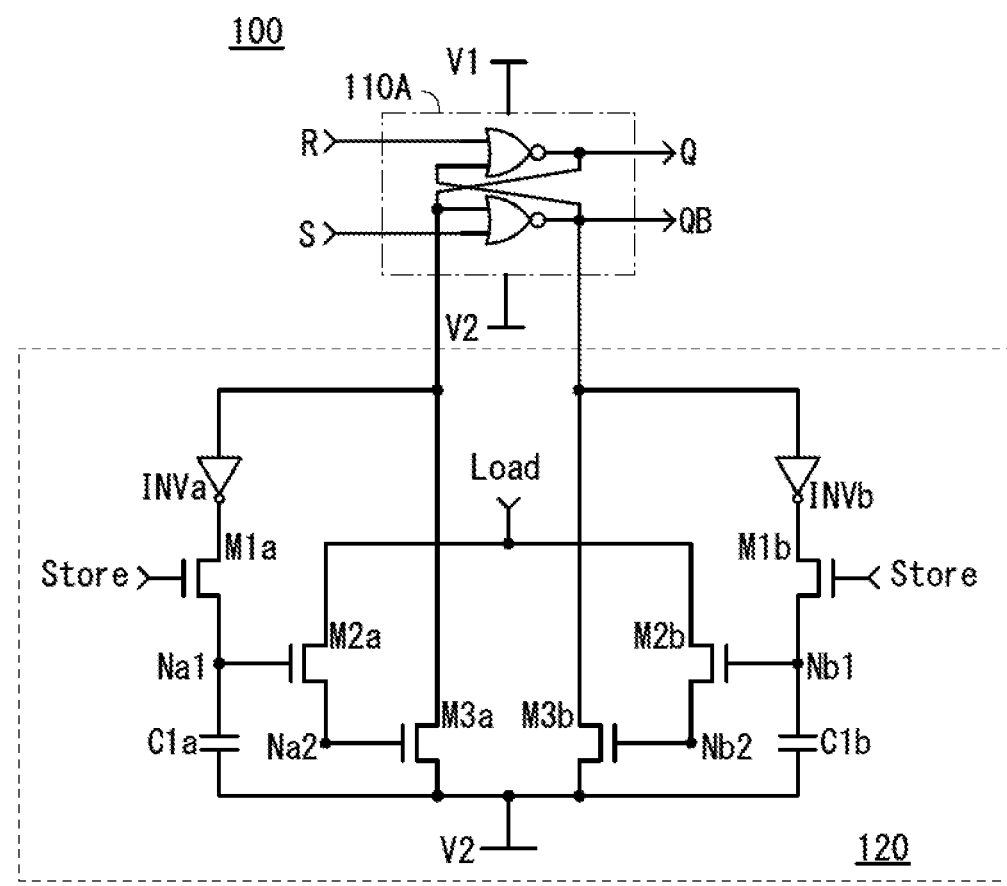
FIG. 5 is a circuit diagram for describing a semiconductor device.
Figure 6:
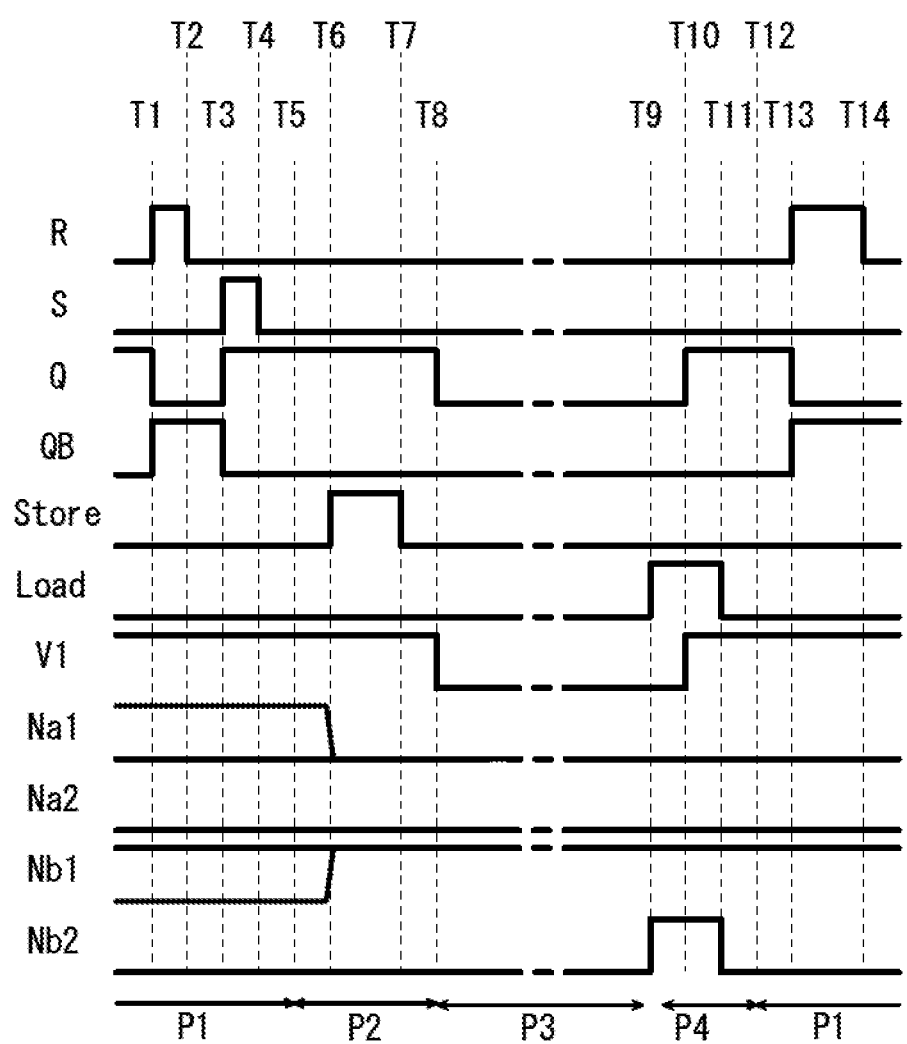
FIG. 6 is a timing chart for describing a semiconductor device.

Next, an example of the operation of the semiconductor device functioning as the register will be described with reference to FIG. 5. FIG. 5 is a circuit diagram of the semiconductor device 100 in which the circuit 110 in FIG. 4 is replaced with a circuit 110A that is an SR latch including two NOR circuits. FIG. 6 is a timing chart for explaining operations of data storing and restoring accompanying stop and restart of supply of power supply voltage in the semiconductor device 100 of FIG. 5.

The timing chart of FIG. 6 shows high and low levels of signal waveforms at the input terminal R, the input terminal S, the output terminal Q, and the output terminal QB; waveforms of the control signal Store and the control signal Load; and waveforms representing changes in the voltage V1 and the voltages of the node Na1, the node Na2, the node Nb1, and the node Nb2. In the timing chart of FIG. 6, a time when the waveform changes is denoted by times T1 to T14. The timing chart of FIG. 6 also shows a period P1 for performing normal operation, a period P2 for performing data storing operation, a period P3 for stopping the supply of power supply voltage, and a period P4 for performing data restoring operation. Although delay or the like is not considered for the waveforms illustrated in FIG. 6, the change in an output signal lags behind the change in an input signal in an actual circuit.

Figure 7:
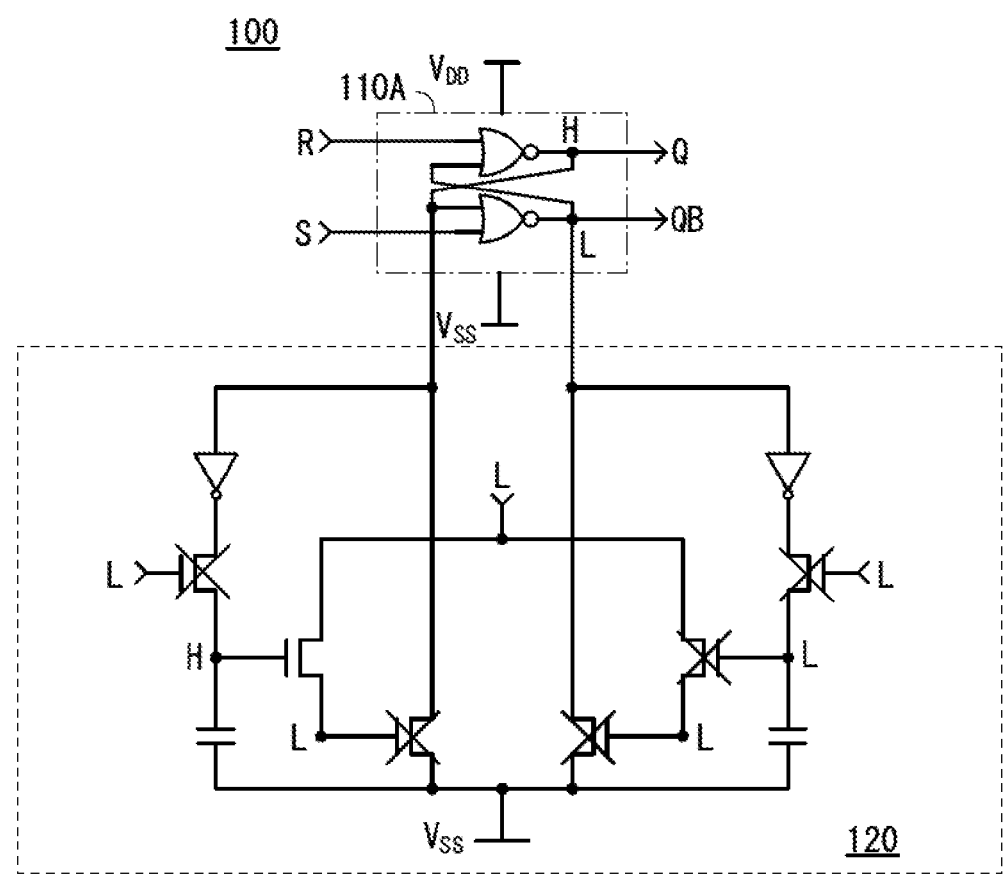
FIG. 7 is a circuit diagram for describing a semiconductor device.
Figure 8:
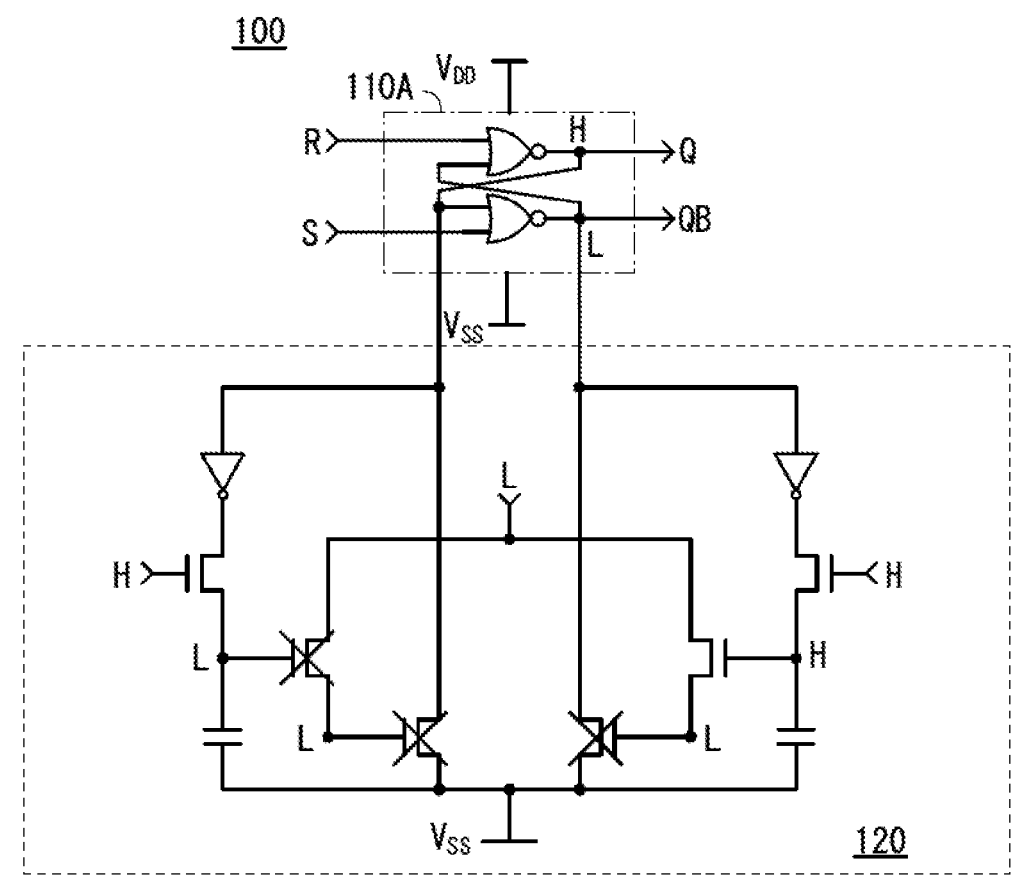
FIG. 8 is a circuit diagram for describing a semiconductor device.
Figure 9:
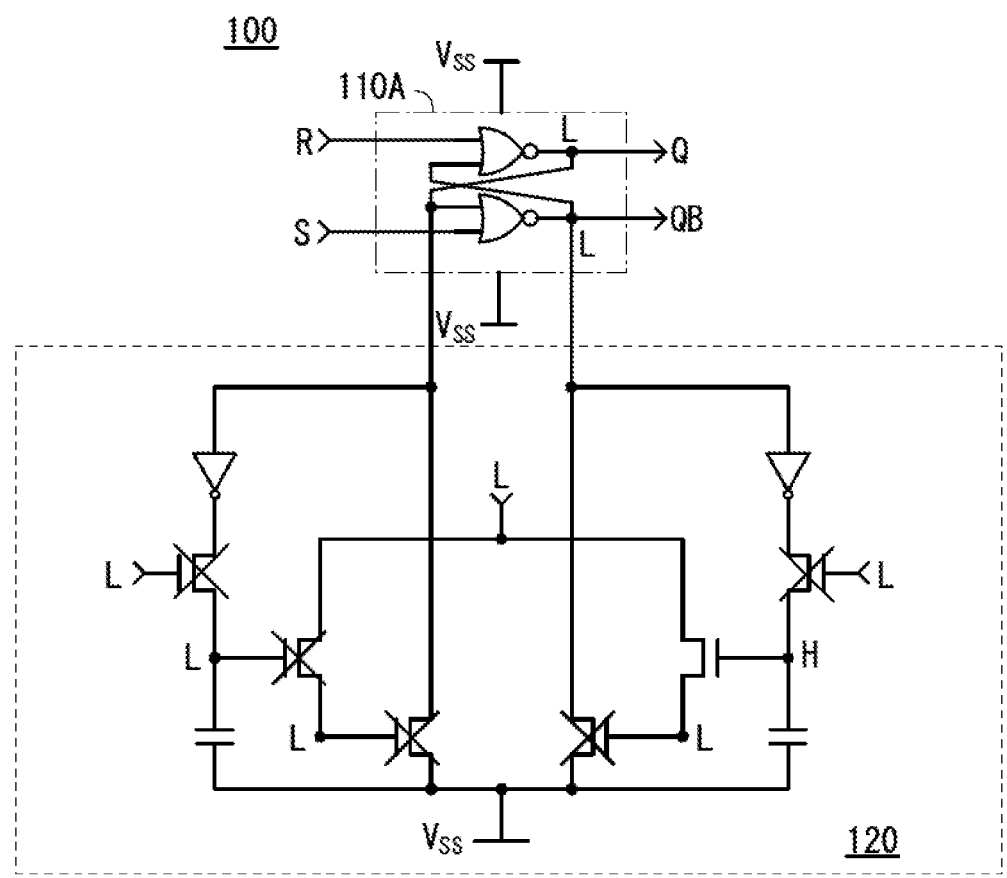
FIG. 9 is a circuit diagram for describing a semiconductor device.
Figure 10:
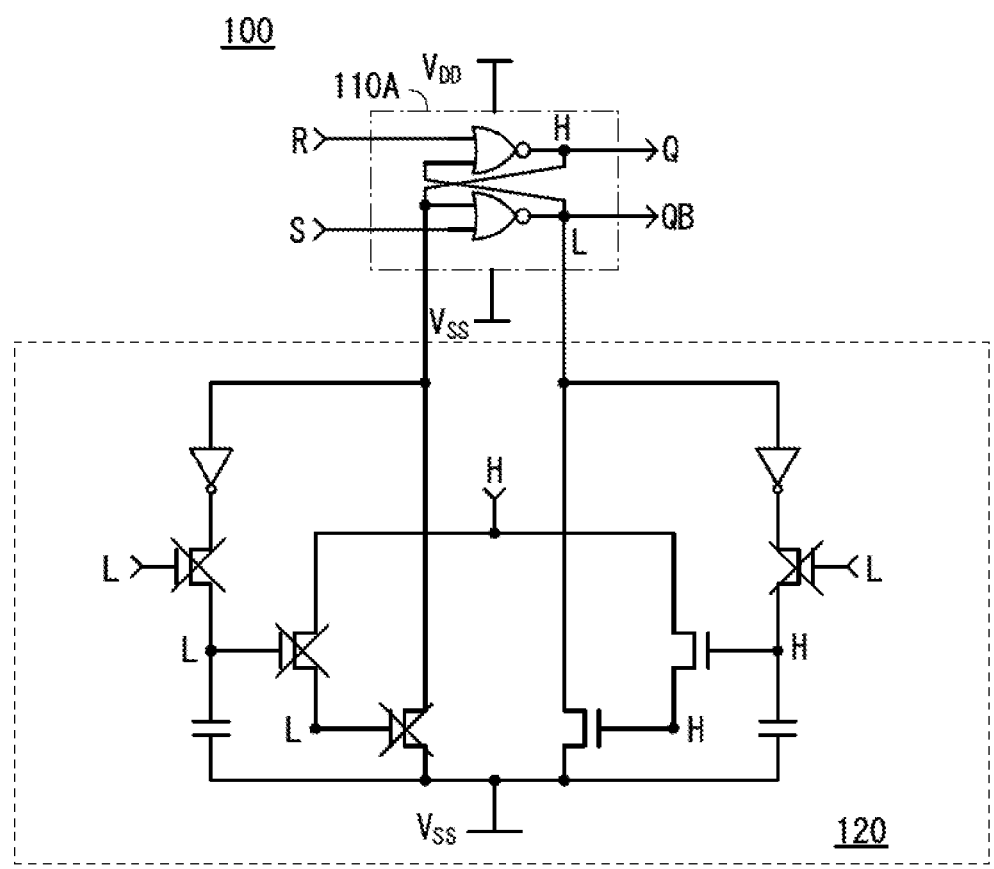
FIG. 10 is a circuit diagram for describing a semiconductor device.

Furthermore, FIGS. 7 to 9 illustrate states where power supply voltage is supplied to the circuit 110A, states of each of the transistors in the circuit 120, states of the control signal Store and the control signal Load, and states of the voltage corresponding to the data in the output terminals or each node in the periods P1 to P4. FIG. 7 corresponds to T3 to T5 in the period P1; FIG. 8, T6 to T7 in the period P2; FIG. 9, T8 to T9 in the period P3; FIG. 10, T10 to T11 in the period P4.

At the time T1 in the period P1, the signal waveform at the input terminal R is changed from low level to high level, and data is reset. The signal waveform at the output terminal Q changes from high level to low level. The signal waveform at the output terminal QB changes from low level to high level. Then, at the time T2 in the period P1, the signal waveform at the input terminal R is changed from high level to low level, and the states of the output terminals Q and QB are maintained. Next, at the time T3 in the period P1, the signal waveform at the input terminal S is changed from low level to high level, and data is set. The signal waveform at the output terminal Q changes from low level to high level. The signal waveform at the output terminal QB changes from high level to low level. Subsequently, at the time T4 in the period P1, the signal waveform at the input terminal S is changed from high level to low level. Then, the states of the output terminals Q and QB are maintained also at the time T5 in the period P1. The above is the description of the period P1.

Next, at the time T6 in the period P2, the control signal Store is changed from low level to high level, and data of the circuit 110A is stored in the circuit 120. The voltages corresponding to the data of the output terminals Q and QB are inverted by the inverters and supplied to the nodes Na1 and Nb1. That is, low-level voltage is supplied to the node Na1 and high-level voltage is supplied to the node Nb1. Then, at the time T7 in the period P2, the control signal Store is changed from high level to low level, and the voltages corresponding to the data supplied to the nodes Na1 and Nb1 are stored in the circuit 120. The voltages held at the nodes Na1 and Nb1 are maintained by setting the control signal Store to low level and turning off the transistors M1a and M1b. In the structure of one embodiment of the present invention, as described above, the transistors M2a and M2b are OS transistors including a thicker gate insulating film than the transistors M3a and M3b, which are Si transistors. Thus, voltages corresponding to data can be easily stored even when the Si transistors are reduced in size and a gate insulating film therein becomes thinner. The above is the description of the period P2.

Next, at the time T8 in the period P3, the voltage V1 is changed from high level to low level (i.e., from the voltage $V_{DD}$ to the voltage $V_{SS}$), and the supply of power supply voltage to the circuit 110A is stopped. The output terminals Q and QB become low level. Meanwhile, the voltages of the nodes Na1 and Nb1 that are held in the period P2 are maintained when the control signal Store is at low level. Accordingly, the circuit 120 can function as a nonvolatile memory device, which is capable of holding data even when the supply of power supply voltage is stopped. The above is the description of the period P3.

Then, at the time T9, the control signal Load is changed from low level to high level, and the data is restored to the circuit 110A in accordance with the voltage held at the node Na1 in the circuit 120. The high-level voltage is held at the node Nb1, and the transistor M2b whose gate is connected to the node Nb1 is turned on. Thus, the voltage of the node Nb2 is changed from low level to high level in accordance with the change in waveform of the control signal Load. On the other hand, the low-level voltage is held at the node Na1, and the transistor M2a whose gate is connected to the node Na1 is turned off. Accordingly, the voltage of the node Na2 remains low level.

Next, at the time T10 in the period P4, the voltage V1 is changed from low level to high level (i.e., from the voltage $V_{SS}$ to the voltage $V_{DD}$), and the supply of power supply voltage to the circuit 110A is restarted. There occurs a difference in the amount of flowing current between the transistors M3a and M3b, which depends on the aforementioned difference in voltage between the node Na2 and the node Nb2 at the time T9. This difference in the current amount causes a difference in voltage rise between the output terminals Q and QB; thus, the output terminal Q becomes high level, and the output terminal QB becomes low level. That is, the original data at the time T5 can be restored to the circuit 110A. Subsequently, at the time T11 in the period P4, the control signal Load is changed from high level to low level, and the voltage of the node Nb2 changes from high level to low level accordingly. At the time T12 in the period P1, the states of the output terminals Q and QB are maintained. The above is the description of the period P4.

At the time T13 in the period P1, the signal waveform at the input terminal R is changed from low level to high level, and data is reset again. The signal waveform at the output terminal Q changes from high level to low level. The signal waveform at the output terminal QB changes from low level to high level. Then, at the time T14 in the period P1, the signal waveform at the input terminal R is changed from high level to low level, and the states of the output terminals Q and QB are maintained.

With the above operations based on the timing chart, the semiconductor device 100 in FIG. 5 can store and restore data accompanied by stop and restart of supply of power supply voltage.

<Modification Examples of Register>

Next, modification examples of the above-described semiconductor device functioning as the register is described.

As the circuit 110 described using FIG. 4, a latch or a flip-flop is used, for example. The circuit 110 can be a D latch, a T latch, a JK latch, an SR latch, or the like, which depends on the kind of data to be applied.

Figure 11A:
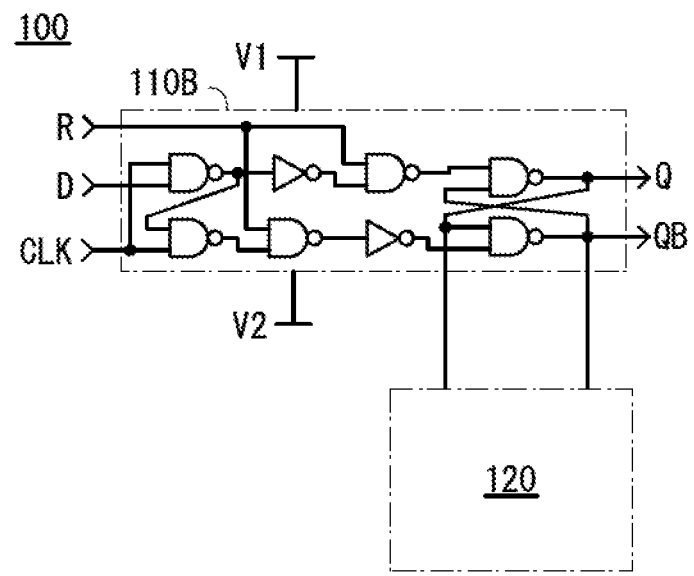
FIGS. 11A and 11B are circuit diagrams for describing a semiconductor device.

For example, as in the circuit 110B illustrated in FIG. 11A, a D latch with a reset terminal be used. In this case, an input terminal R for reset, an input terminal D for data input, and a terminal CLK for supplying a clock signal are provided. The circuit 120 is provided to be connected to the output terminals Q and QB as illustrated in FIG. 11A.

As another variation of the circuit 110 described using FIG. 4, static random access memory (SRAM) can be used, for example.

Figure 11B:
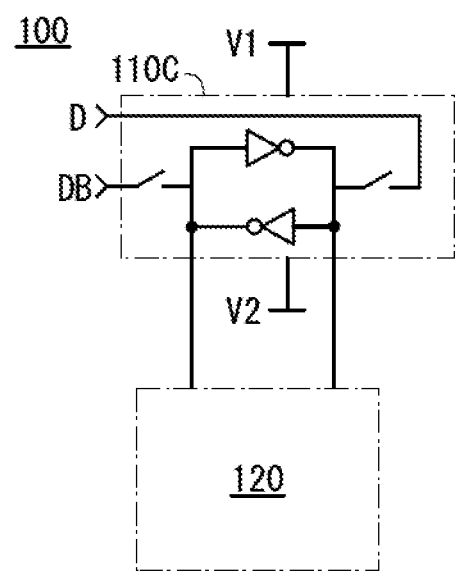

As in the circuit 110C illustrated in FIG. 11B, SRAM can be used, for example. In this case, input terminals D and DB for data input are provided. The circuit 120 is provided to be connected to two terminals included in the inverter loop as illustrated in FIG. 11B.

Figure 12:
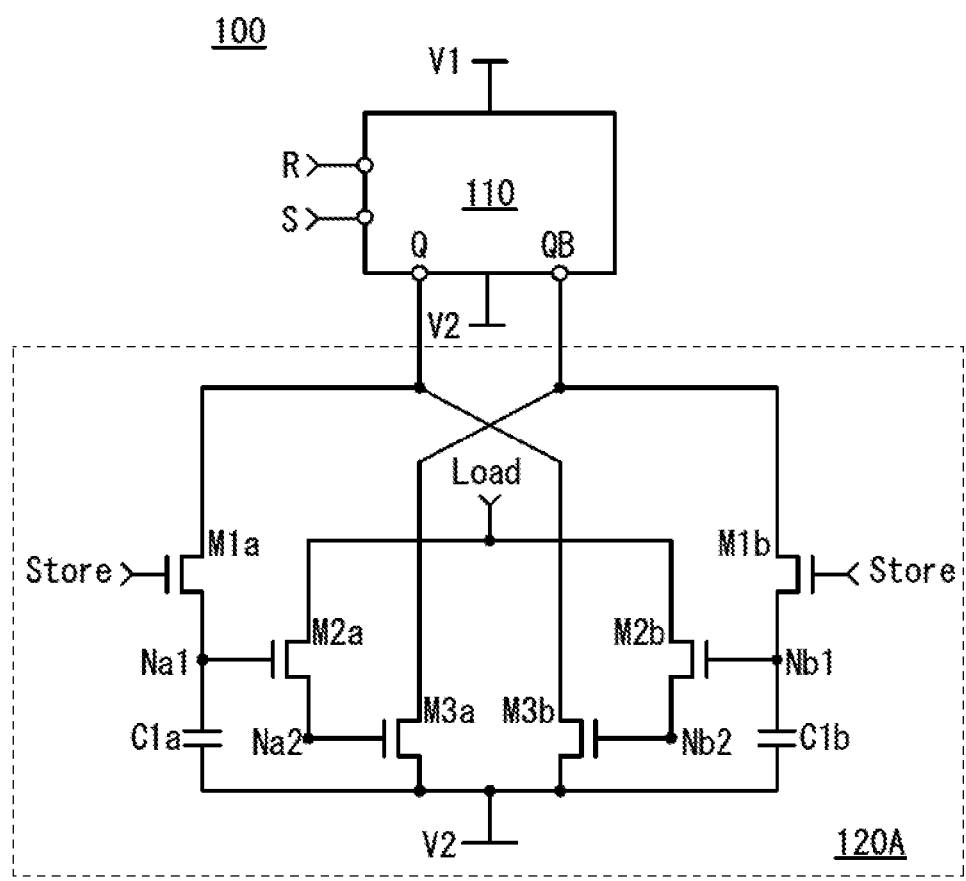
FIG. 12 is a circuit diagram for describing a semiconductor device.

In the circuit 120 described using FIG. 4, the inverters INVa and INVb can be omitted, for example. FIG. 12 is a circuit diagram of the semiconductor device 100 including a circuit 120A from which the inverters INVa and INVb are omitted. The circuit 120A differs from the circuit 120 described using FIG. 4 in that the output terminal Q is connected to the transistor M3b and the output terminal QB is connected to the transistor M3a. Accordingly, data can be stored and restored without the inverters INVa and INVb.

Figure 13A:
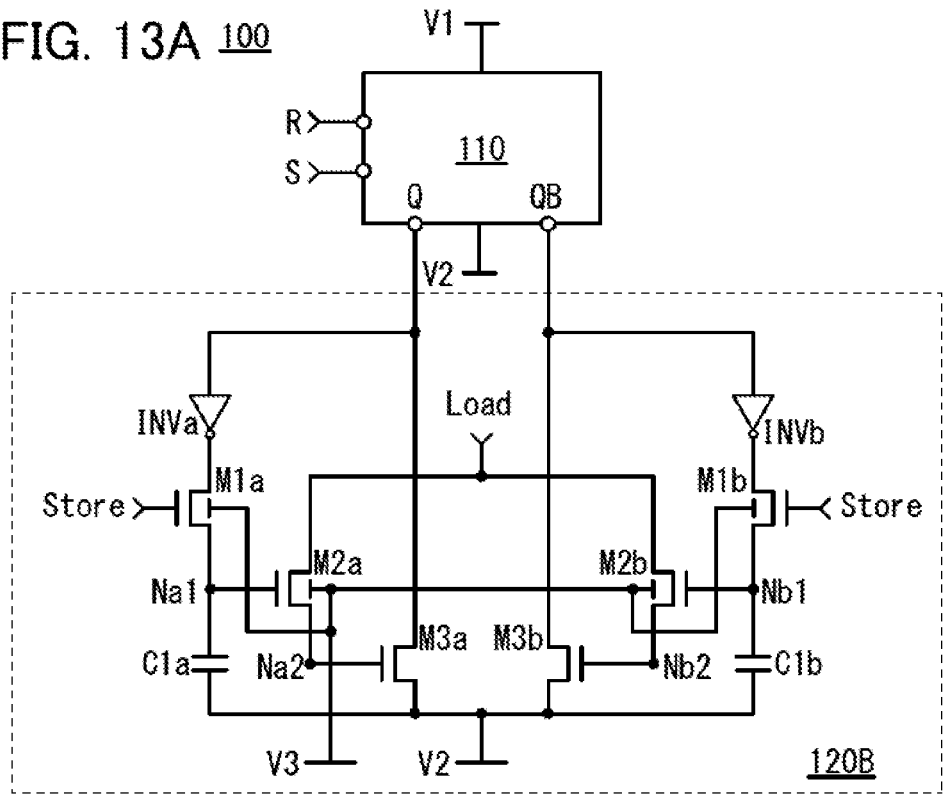
FIGS. 13A and 13B are circuit diagrams for describing a semiconductor device.
Figure 13B:
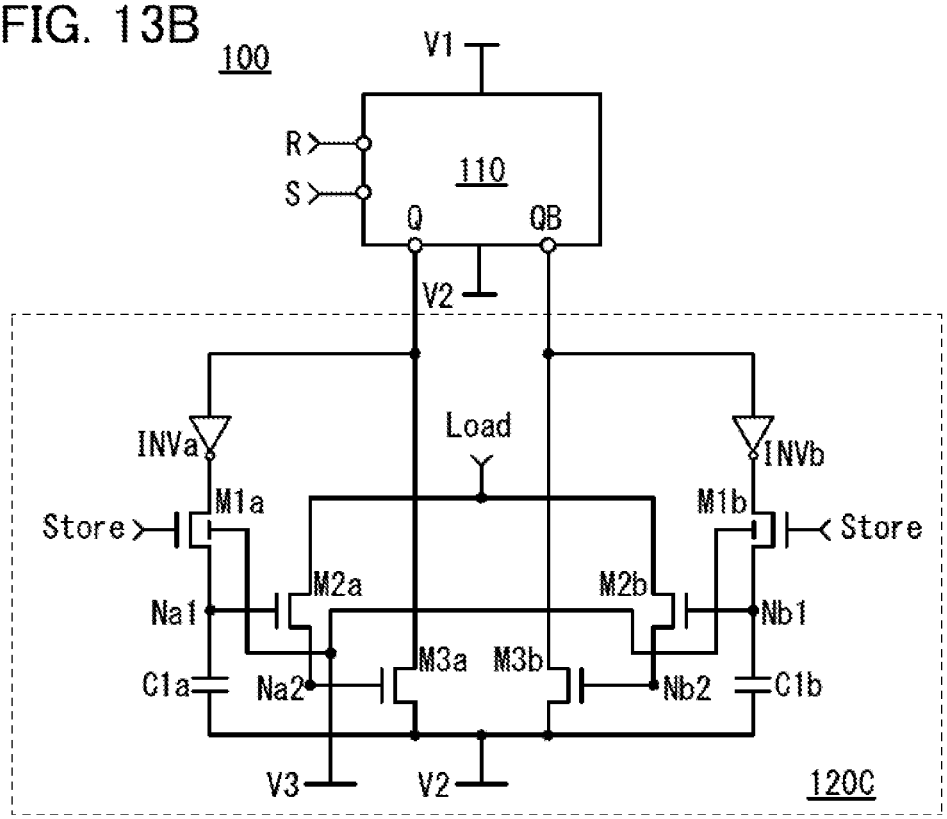

The transistors M1a, M1b, M2a, and M2b, which are OS transistors as described using FIG. 4, preferably have a backgate. Accordingly, the threshold voltage of these transistors can be easily controlled by changing voltage applied to their backgates. For example, the threshold voltage of each of the transistors M1a, M1b, M2a, and M2b is controlled by applying voltage V3 in common to their backgates as illustrated in FIG. 13A. Note that the voltage V3 is preferably lower than the voltage V2, in which case the threshold voltage of the transistors can be more easily shifted in the positive direction. As illustrated in FIG. 13B, only the transistors M1a and M1b, in which the other of the source and the drain is connected to the nodes Na1 and Nb1 for holding data, may have a backgate. This structure allows the transistors M2a and M2b without a backgate to be turned on easily.

<Operation Example of Decoder>

Figure 14A:
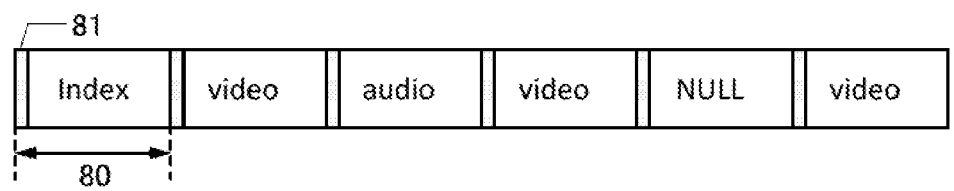
FIG. 14A is a block diagram illustrating a structure example of a decoder.

An example of a data structure of a transport stream (TS) is shown in FIG. 14A. The transport stream includes a structure of a series of TS packets 80 (also referred to as a packet) containing various (multiplexed) data. A header portion 81 is provided in each packet.

Note that although the TS is taken as a typical example of a data transmission method here, the TS can be replaced with another data transmission method such as MPEG media transport (MMT) as appropriate. Furthermore, a packet is a piece of data which is part of the data stream divided by the appropriate amount of data. Although the TS packet is taken as a typical example here, the TS packet can be replaced with various packets which can be used in other transmission methods as appropriate.

The TS packet 80 has a different interpretation of data (payload) in the TS packet 80 depending on the kind, such as an index, video, audio, NULL, and the like; thus, the kind of the TS packet 80 needs to be specified by the identifier (packet identifier, PID) which is provided in the header portion 81.

Furthermore, in order to synchronize a transmitter and a receiver of the transport stream, a TS packet containing data on the time of reproducing a moving image or a time stamp may be included.

Figure 14B:
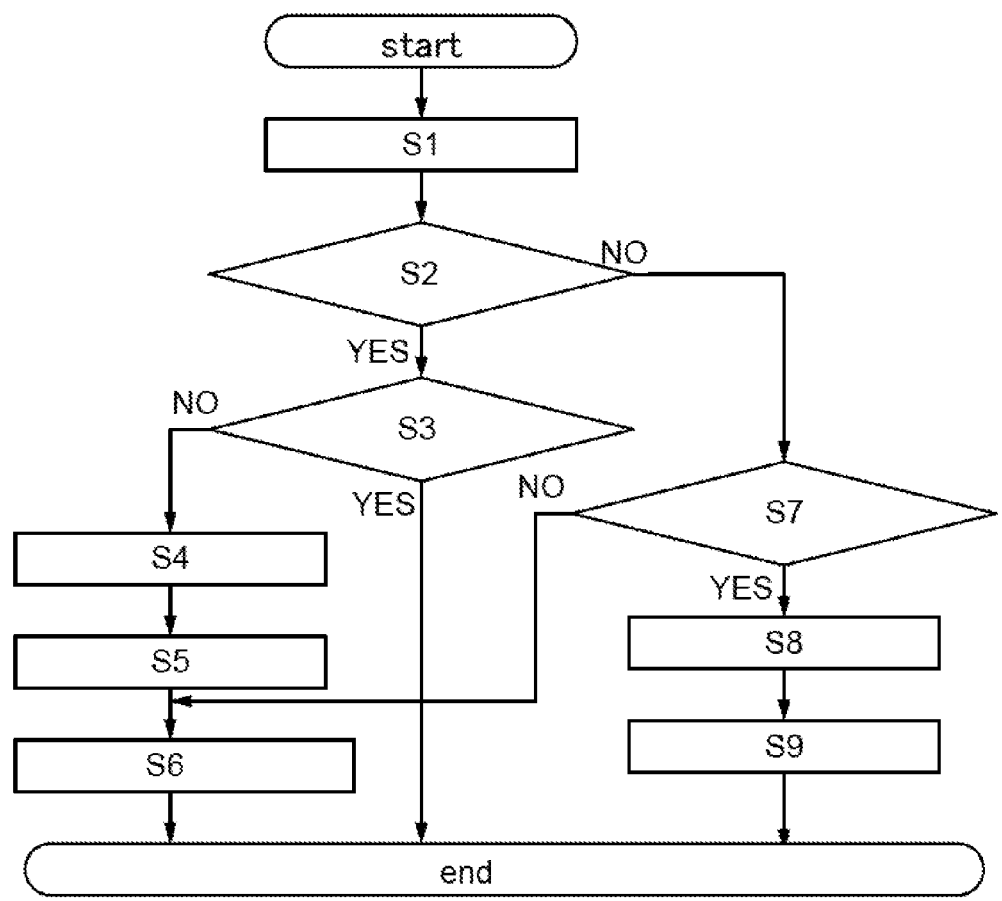
FIG. 14B is a flow chart illustrating a structure example of a decoder.

The TS packets including the data structure shown in FIG. 14A are processed in a demultiplexing circuit included in the decoder. FIG. 14B is a flow chart describing the operation steps when the TS packet 80 is input to the demultiplexing circuit.

In Step S1, the packet identifier (PID) in the header portion 81 of the TS packet 80 is detected.

In Step S2, whether or not the kind of the previous TS packet 80 is NULL is determined.

In Step S3, when the kind of the previous TS packet 80 is NULL, whether or not the present TS packet 80 is NULL is determined. When the kind of the present TS packet 80 is NULL in Step S3, the next TS packet 80 is input to the demultiplexing circuit.

In Step S4, when the kind of the present TS packet 80 in Step S3 is not NULL, power is supplied to a register included in the demultiplexing circuit and a multi-media decoding circuit (e.g., an electronic program guide decoding circuit, a video decoding circuit, and an audio decoding circuit), in other words, the semiconductor device described above.

In Step S5, data restoring from the data retention circuit to the flip-flop is performed in the register included in the demultiplexing circuit and the multi-media decoding circuit.

In Step S6, the payload of the present TS packet 80 is decoded in the demultiplexing circuit and the multi-media decoding circuit. Then the next TS packet 80 is input to the demultiplexing circuit.

In Step S7, when the kind of the previous TS packet 80 is not NULL, whether or not the present TS packet 80 is NULL is determined.

In Step S8, when the kind of the present TS packet 80 in Step S7 is NULL, data is stored from the flip-flop to the data retention circuit in the register included in the demultiplexing circuit and the multi-media decoding circuit.

In Step S9, the power supply to the register included in the demultiplexing circuit and the multi-media decoding circuit, in other words, the semiconductor device described above is stopped. Then, the next TS packet 80 is input to the demultiplexing circuit.

In the above manner, when the TS packet 80 is input to the decoder, the kind of the TS packet 80 is determined from the packet identifier (PID) in the header portion 81 of the TS packet 80, storing or restoring of data is performed, and power supply to the register is provided or stopped. Such a structure can reduce power consumption of the register.

Figure 15:
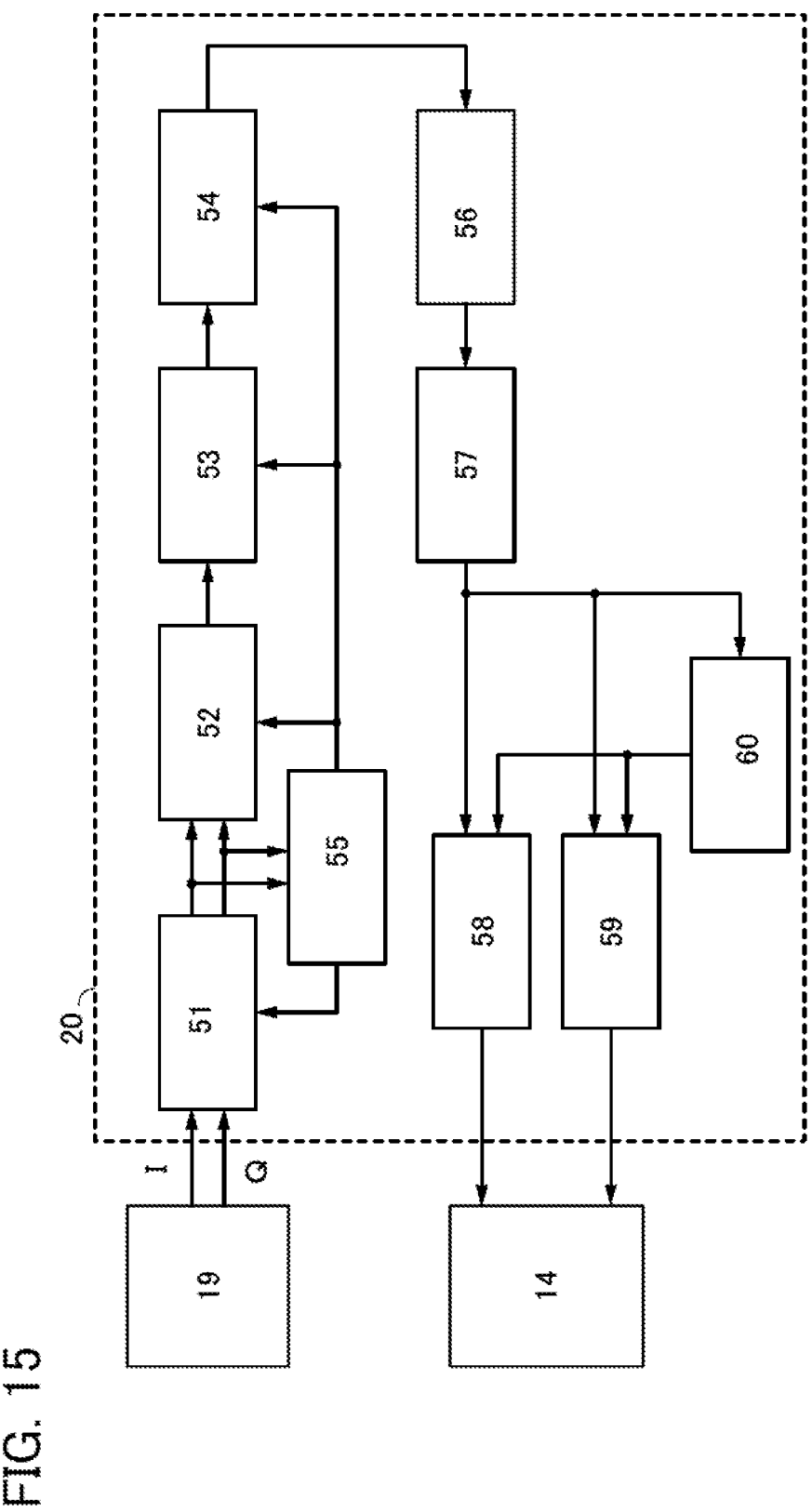
FIG. 15 is a block diagram illustrating a structure example of a decoder.

FIG. 15 is a block diagram of the decoder 20 that performs the processing illustrated in FIG. 14B.

The I signal and the Q signal are input from the demodulator 19 to the decoder 20.

The I signal and the Q signal that are input to the decoder 20 are subjected to extraction of an encoded transmission and multiplexing configuration control (TMCC) and extraction of low density parity check (LDPC) code by an quadrature detection circuit 51.

The encoded TMCC is decoded by a TMCC decoding circuit 55 and is utilized for a low density parity check (LDPC) code decoding circuit 52, an energy reverse spreading circuit 53, and a Bose-Chaudhuri-Hocquenghem (BCH) code decoding circuit 54.

When the LDPC code decoding circuit 52, the energy reverse spreading circuit 53, and the BCH code decoding circuit 54 perform decoding, the I signal and the Q signal become a transmission format of a video signal and an audio signal.

The above transmission format is subjected to decryption in a conditional access (CA) reverse spreading circuit 56.

Then, demultiplexing is performed on a multiplexed transmission method of a video, audio, electronic program guide (EPG), and the like by a demultiplexing circuit 57.

Electronic program guide data is decoded in an electronic program guide decoding circuit 60 by demultiplexing.

Similarly, video data is decoded in a video decoding circuit 58. Furthermore, audio data is decoded in an audio decoding circuit 59. Furthermore, output electronic program guide data obtained in the electronic program guide decoding circuit 60 is used in the video decoding circuit 58 and the audio decoding circuit 59 when decoding is performed.

The video data and the audio data that are decoded by the video decoding circuit 58 and the audio decoding circuit 59, respectively, are transferred to the display device 14.

Embodiment 2

In this embodiment, the OS transistor described in the above embodiments will be described.

<Off-State Current Characteristics>

The off-state current of an OS transistor can be reduced by reducing the concentration of impurities in an oxide semiconductor to make the oxide semiconductor intrinsic or substantially intrinsic. The term "substantially intrinsic" refers to a state where an oxide semiconductor has a carrier density lower than $8\times10^{11}/cm^3$, preferably lower than $1\times10^{11}/cm^3$, more preferably lower than $1\times10^{10}/cm^3$, and higher than or equal to $1\times10^{-9}/cm^3$. In the oxide semiconductor, hydrogen, nitrogen, carbon, silicon, and a metal element other than main components of the oxide semiconductor are impurities. For example, hydrogen and nitrogen form donor levels to increase the carrier density.

A transistor using an intrinsic or substantially intrinsic oxide semiconductor has a low carrier density and thus is less likely to have negative threshold voltage. In addition, because of few carrier traps in such an oxide semiconductor, the transistor using the oxide semiconductor has small variation in electrical characteristics and high reliability. Furthermore, the transistor using the oxide semiconductor achieves an ultralow off-state current.

For example, an OS transistor with reduced off-state current can exhibit a normalized off-state current per micrometer in channel width of $1\times10^{-18}$ A or less, preferably $1\times10^{-21}$ A or less, more preferably $1\times10^{-24}$ A or less at room temperature (approximately 25° C.), or $1\times10^{-15}$ A or less, preferably $1\times10^{-18}$ A or less, more preferably $1\times10^{-21}$ A or less at 85° C.

<Temperature Characteristics>

Figure 27A:
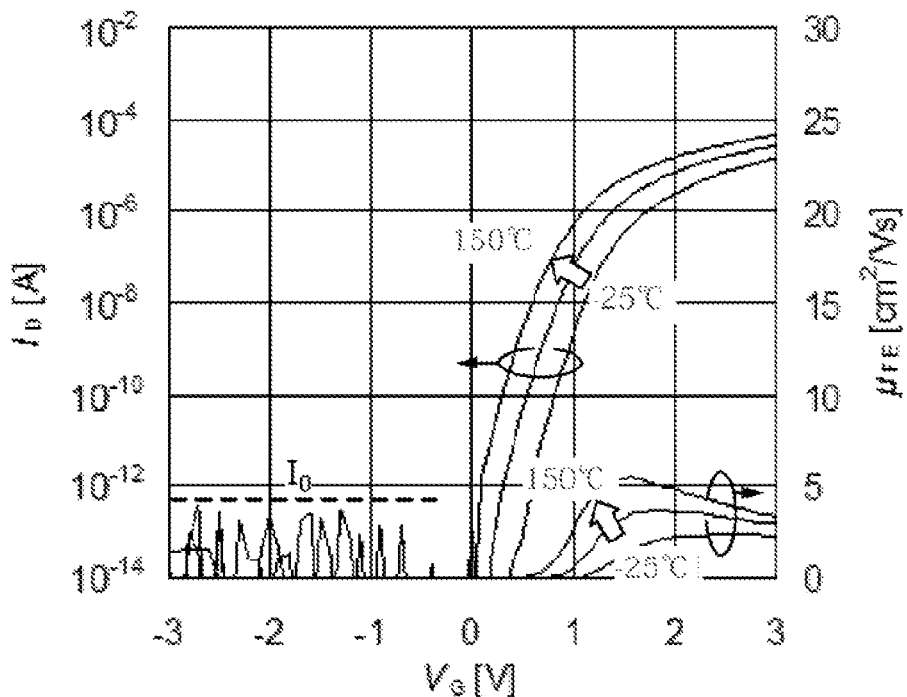
FIGS. 27A and 27B are graphs showing characteristics of transistors.
Figure 27B:
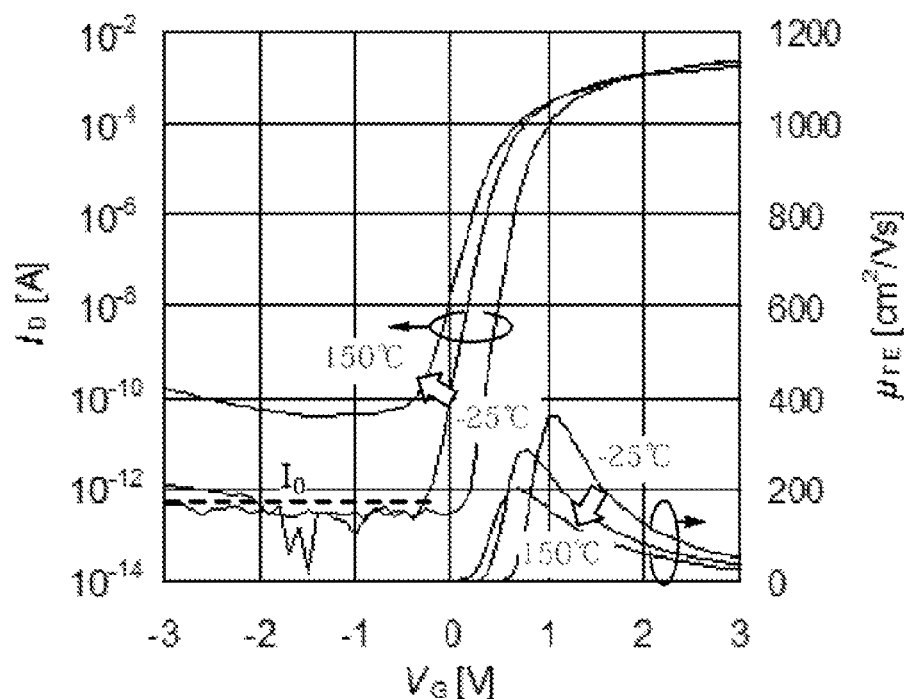

An OS transistor can be used at higher temperatures than a Si transistor. As specific examples, FIG. 27A shows temperature dependence of drain current-gate voltage ($I_D$-$V_G$) characteristics and electric field mobility-gate voltage ($\mu_{FE}$-$V_G$) characteristics of an OS transistor, and FIG. 27B shows temperature dependence of $I_D$-$V_G$ characteristics and $\mu_{FE}$-$V_G$ characteristics of a Si transistor. FIGS. 27A and 27B show measurement results of the electrical characteristics at −25° C., 50° C., and 150° C. Note that the drain voltage $V_D$ is 1 V.

FIG. 27A shows the electrical characteristics of an OS transistor that has a channel length L of 0.45 μm, a channel width W of 10 μm, and a thickness $T_{ox}$ of an oxide film serving as a gate insulating layer of 20 nm. FIG. 27B shows the electrical characteristics of a Si transistor that has L of 0.35 W of 10 μm, and $T_{ox}$ of 20 nm.

An oxide semiconductor layer in the OS transistor is made of an In—Ga—Zn-based oxide. The Si transistor is formed using a silicon wafer.

FIGS. 27A and 27B show that the rising gate voltage of the OS transistor has low temperature dependence. The off-state current of the OS transistor is lower than or equal to the lower measurement limit ($I_0$) independently of temperature. In contrast, the off-state current of the Si transistor largely depends on the temperature. According to the measurement results of FIG. 27B, at 150° C., the off-state current of the Si transistor increases, and a sufficiently high current on/off ratio cannot be obtained.

According to the graphs in FIGS. 27A and 27B, an OS transistor used as a switch can operate even at 150° C. or higher. Thus, a semiconductor device can have excellent heat resistance.

<Breakdown Voltage>

Here, the breakdown voltage of an OS transistor will be described in comparison with the breakdown voltage of a Si transistor.

Figure 28:
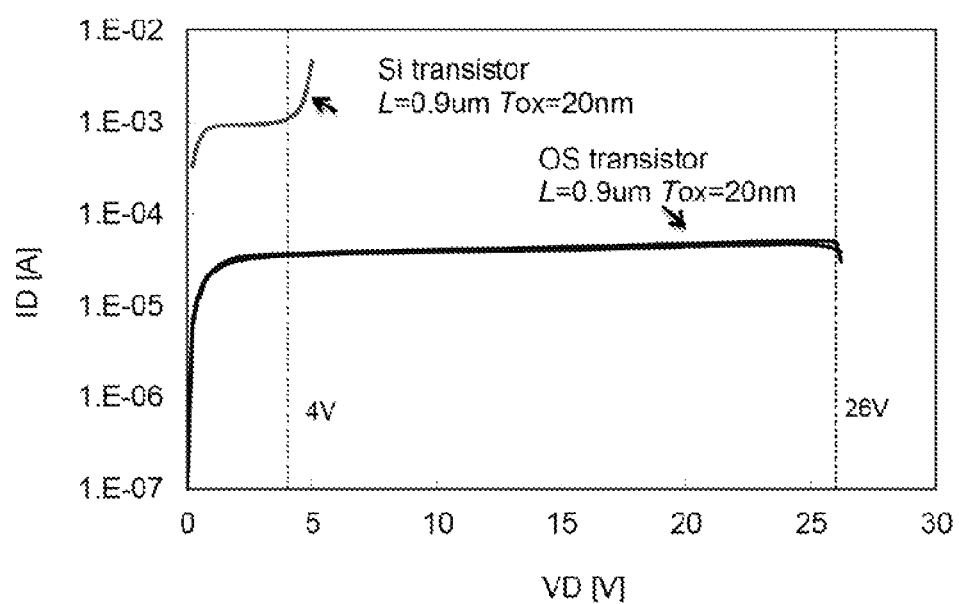
FIG. 28 is a graph showing characteristics of transistors.

FIG. 28 shows $I_D$-$V_D$ curves of a Si transistor and an OS transistor for explaining the drain breakdown voltage of the OS transistor. In FIG. 28, to compare the breakdown voltages of the Si and OS transistors under the same conditions, both of the transistors have a channel length L of 0.9 μm, a channel width W of 10 μm, and a gate insulating film using silicon oxide with a thickness $T_{ox}$ of 20 nm. Note that the gate voltage is 2 V.

As shown in FIG. 28, avalanche breakdown occurs in the Si transistor at a drain voltage of approximately 4 V, whereas in the OS transistor, a constant current can flow until a drain voltage of approximately 26 V causes avalanche breakdown.

Figure 29A:
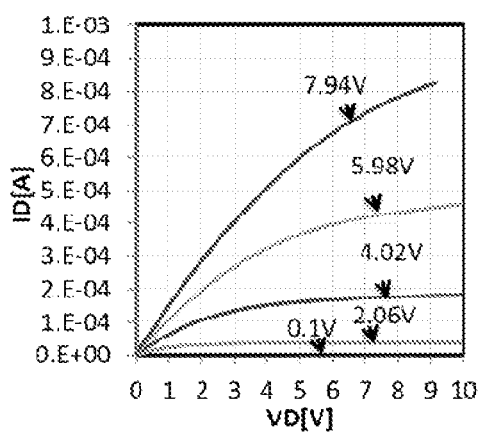
FIGS. 29A and 29B are graphs showing characteristics of transistors.
Figure 29B:
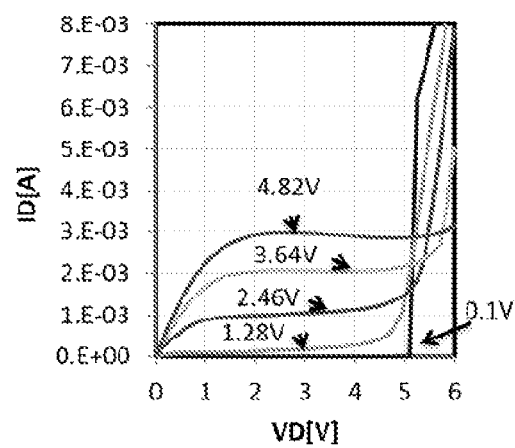

FIG. 29A shows $I_D$-$V_D$ curves of an OS transistor with varying gate voltage. FIG. 29B shows $I_D$-$V_D$ curves of a Si transistor with varying gate voltage. In FIGS. 29A and 29B, to compare breakdown voltages between the Si transistor and the OS transistor under the same conditions, both of the transistors have a channel length of 0.9 μm, a channel width of 10 μm, and a thickness of a gate insulating film using silicon oxide of 20 nm. The gate voltage changes from 0.1 V to 2.06 V, 4.02 V, 5.98 V, and 7.94 V in the OS transistor of FIG. 29A, and changes from 0.1 V to 1.28 V, 2.46 V, 3.64 V, and 4.82 V in the Si transistor of FIG. 29B.

As shown in FIGS. 29A and 29B, avalanche breakdown occurs in the Si transistor at a drain voltage of approximately 4 V to 5 V, whereas in the OS transistor, a constant current can flow until a drain voltage of approximately 9 V causes avalanche breakdown.

As shown in FIG. 28 and FIGS. 29A and 29B, an OS transistor has higher breakdown voltage than a Si transistor. Therefore, even when an OS transistor is provided in a portion to which high voltage is supplied, the OS transistor can operate stably without causing dielectric breakdown.

<Off-State Current>

Unless otherwise specified, the off-state current in this specification refers to a drain current of a transistor in the off state (also referred to as non-conduction state and cutoff state). Unless otherwise specified, the off state of an n-channel transistor means that the voltage between its gate and source (Vgs: gate-source voltage) is lower than the threshold voltage Vth, and the off state of a p-channel transistor means that the gate-source voltage Vgs is higher than the threshold voltage Vth. For example, the off-state current of an n-channel transistor sometimes refers to a drain current that flows when the gate-source voltage Vgs is lower than the threshold voltage Vth.

The off-state current of a transistor depends on Vgs in some cases. For this reason, when there is Vgs at which the off-state current of a transistor is lower than or equal to I, it may be said that the off-state current of the transistor is lower than or equal to I. The off-state current of a transistor may refer to an off-state current at given Vgs, at Vgs in a given range, or at Vgs at which a sufficiently low off-state current is obtained.

As an example, the assumption is made of an n-channel transistor where the threshold voltage Vth is 0.5 V and the drain current is $1\times10^{-9}$ A at Vgs of 0.5 V, $1\times10^{-13}$ A at Vgs of 0.1 V, $1\times10^{-19}$ A at Vgs of −0.5 V, and $1\times10^{-22}$ A at Vgs of −0.8 V. Since the drain current of the transistor is $1\times10^{-19}$ A or lower at Vgs of −0.5 V or at Vgs in the range of −0.5 V to −0.8 V, it can be said that the off-state current of the transistor is $1\times10^{-19}$ A or lower. Since there is Vgs at which the drain current of the transistor is $1\times10^{-22}$ A or lower, it may be said that the off-state current of the transistor is $1\times10^{-22}$ A or lower.

In this specification, the off-state current of a transistor with a channel width W is sometimes represented by a current value in relation to the channel width W. Furthermore, the off-state current of a transistor with a channel width W is sometimes represented by a current value per given channel width (e.g., 1 μm). In the latter case, the unit of off-state current may be represented by current per length (e.g., A/μm).

The off-state current of a transistor depends on temperature in some cases. Unless otherwise specified, the off-state current in this specification may be an off-state current at room temperature, 60° C., 85° C., 95° C., or 125° C. Alternatively, the off-state current may be an off-state current at a temperature at which the reliability of a semiconductor device or the like including the transistor is ensured or a temperature at which the semiconductor device or the like is used (e.g., temperature in the range of 5° C. to 35° C.). When there is Vgs at which the off-state current of a transistor at room temperature, 60° C., 85° C., 95° C., 125° C., a temperature at which the reliability of a semiconductor device or the like including the transistor is ensured, or a temperature at which the semiconductor device or the like is used (e.g., temperature in the range of 5° C. to 35° C.) is lower than or equal to I, it may be said that the off-state current of the transistor is lower than or equal to I.

The off-state current of a transistor depends on voltage between its drain and source (Vds) in some cases. Unless otherwise specified, the off-state current in this specification may be an off-state current at Vds with an absolute value of 0.1 V, 0.8 V, 1 V, 1.2 V, 1.8 V, 2.5 V, 3 V, 3.3 V, 10 V, 12 V, 16 V, or 20 V. Alternatively, the off-state current may be an off-state current at Vds at which the reliability of a semiconductor device or the like including the transistor is ensured or Vds used in the semiconductor device or the like. When there is Vgs at which the off-state current of a transistor is lower than or equal to I at given Vds, it may be said that the off-state current of the transistor is lower than or equal to I. Here, given Vds is, for example, 0.1 V, 0.8 V, 1 V, 1.2 V, 1.8 V, 2.5 V, 3 V, 3.3 V, 10 V, 12 V, 16 V, 20 V, Vds at which the reliability of a semiconductor device or the like including the transistor is ensured, or Vds used in the semiconductor device or the like.

In the above description of off-state current, a drain may be replaced with a source. That is, the off-state current sometimes refers to a current that flows through a source of a transistor in the off state.

In this specification, the term "leakage current" sometimes expresses the same meaning as off-state current.

In this specification, the off-state current sometimes refers to a current that flows between a source and a drain when a transistor is off, for example.

<Composition of Oxide Semiconductor>

An oxide semiconductor used for a semiconductor layer of an OS transistor preferably contains at least indium (In) or zinc (Zn). In particular, In and Zn are preferably contained. A stabilizer for strongly bonding oxygen is preferably contained in addition to In and Zn. As a stabilizer, at least one of gallium (Ga), tin (Sn), zirconium (Zr), hafnium (Hf), and aluminum (Al) is contained.

As another stabilizer, the oxide semiconductor may contain one or more kinds of lanthanoid such as lanthanum (La), cerium (Ce), praseodymium (Pr), neodymium (Nd), samarium (Sm), europium (Eu), gadolinium (Gd), terbium (Tb), dysprosium (Dy), holmium (Ho), erbium (Er), thulium (Tm), ytterbium (Yb), and lutetium (Lu).

As the oxide semiconductor used for the semiconductor layer of the transistor, any of the following can be used, for example: indium oxide, tin oxide, zinc oxide, In—Zn-based oxide, Sn—Zn-based oxide, Al—Zn-based oxide, Zn—Mg-based oxide, Sn—Mg-based oxide, In—Mg-based oxide, In—Ga-based oxide, In—Ga—Zn-based oxide (also referred to as IGZO), In—Al—Zn-based oxide, In—Sn—Zn-based oxide, Sn—Ga—Zn-based oxide, Al—Ga—Zn-based oxide, Sn—Al—Zn-based oxide, In—Hf—Zn-based oxide, In—Zr—Zn-based oxide, In—Ti—Zn-based oxide, In—Sc—Zn-based oxide, In—Y—Zn-based oxide, In—La—Zn-based oxide, In—Ce—Zn-based oxide, In—Pr—Zn-based oxide, In—Nd—Zn-based oxide, In—Sm—Zn-based oxide, In—Eu—Zn-based oxide, In—Gd—Zn-based oxide, In—Tb—Zn-based oxide, In—Dy—Zn-based oxide, In—Ho—Zn-based oxide, In—Er—Zn-based oxide, In—Tm—Zn-based oxide, In—Yb—Zn-based oxide, In—Lu—Zn-based oxide, In—Sn—Ga—Zn-based oxide, In—Hf—Ga—Zn-based oxide, In—Al—Ga—Zn-based oxide, In—Sn—Al—Zn-based oxide, In—Sn—Hf—Zn-based oxide, and In—Hf—Al—Zn-based oxide.

For example, it is possible to use In—Ga—Zn-based oxide with an atomic ratio of In:Ga:Zn=1:1:1, 3:1:2, 4:2:3, or 2:1:3 or close thereto.

<Impurities in Oxide Semiconductor>

If an oxide semiconductor film forming the semiconductor layer contains a large amount of hydrogen, the hydrogen and the oxide semiconductor are bonded to each other, so that part of the hydrogen serves as a donor and causes generation of an electron which is a carrier. As a result, the threshold voltage of the transistor shifts in the negative direction. It is therefore preferred that after formation of the oxide semiconductor film, dehydration treatment (dehydrogenation treatment) be performed to remove hydrogen or moisture from the oxide semiconductor film so that the oxide semiconductor film is highly purified to contain impurities as little as possible.

Note that oxygen in the oxide semiconductor film is also reduced by the dehydration treatment (dehydrogenation treatment) in some cases. For this reason, it is preferred that oxygen be added to the oxide semiconductor film to fill oxygen vacancies increased by the dehydration treatment (dehydrogenation treatment).

In this manner, hydrogen or moisture is removed from the oxide semiconductor film by the dehydration treatment (dehydrogenation treatment) and oxygen vacancies therein are filled by oxygen adding treatment, whereby the oxide semiconductor film can be transformed to an i-type (intrinsic) oxide semiconductor film or a substantially i-type (intrinsic) oxide semiconductor film that is extremely close to an i-type oxide semiconductor film. The term "substantially intrinsic" means that the oxide semiconductor film contains extremely few (close to zero) carriers derived from a donor and has a carrier density of lower than $8\times10^{11}/cm^3$, preferably lower than $1\times10^{11}/cm^3$, further preferably lower than $1\times10^{10}/cm^3$, and higher than or equal to $1\times10^{-9}/cm^3$.

<Structure of Oxide Semiconductor>

Next, a structure of an oxide semiconductor will be described.

In this specification, the term "parallel" indicates that the angle formed between two straight lines is greater than or equal to −10° and less than or equal to 10°, and accordingly also includes the case where the angle is greater than or equal to −5° and less than or equal to 5°. The term "substantially parallel" indicates that the angle formed between two straight lines is greater than or equal to −30° and less than or equal to 30°. The term "perpendicular" indicates that the angle formed between two straight lines is greater than or equal to 80° and less than or equal to 100°, and accordingly also includes the case where the angle is greater than or equal to 85° and less than or equal to 95°. The term "substantially perpendicular" indicates that the angle formed between two straight lines is greater than or equal to 60° and less than or equal to 120°.

In this specification, trigonal and rhombohedral crystal systems are included in a hexagonal crystal system.

An oxide semiconductor film is classified into a non-single-crystal oxide semiconductor film and a single crystal oxide semiconductor film. Alternatively, an oxide semiconductor is classified into, for example, a crystalline oxide semiconductor and an amorphous oxide semiconductor.

Examples of a non-single-crystal oxide semiconductor include a c-axis-aligned crystalline oxide semiconductor (CAAC-OS), a polycrystalline oxide semiconductor, a microcrystalline oxide semiconductor, and an amorphous oxide semiconductor. Examples of a crystalline oxide semiconductor include a single crystal oxide semiconductor, a CAAC-OS, a polycrystalline oxide semiconductor, and a microcrystalline oxide semiconductor.

First, a CAAC-OS film will be described.

The CAAC-OS film is one of oxide semiconductor films having a plurality of c-axis aligned crystal parts.

When a combined analysis image (also referred to as high-resolution TEM image) of a bright-field image and a diffraction pattern of the CAAC-OS film is observed with a transmission electron microscope (TEM), a plurality of crystal parts are observed. However, in the high-resolution TEM image, a boundary between crystal parts, that is, a grain boundary is not clearly observed. Thus, in the CAAC-OS film, a reduction in electron mobility due to the grain boundary is less likely to occur.

According to the high-resolution cross-sectional TEM image of the CAAC-OS film observed in a direction substantially parallel to the sample surface, metal atoms are arranged in a layered manner in the crystal parts. Each metal atom layer reflects unevenness of a surface over which the CAAC-OS film is formed (hereinafter, a surface over which the CAAC-OS film is formed is referred to as a formation surface) or a top surface of the CAAC-OS film, and is arranged parallel to the formation surface or the top surface of the CAAC-OS film.

According to the high-resolution plan-view TEM image of the CAAC-OS film observed in a direction substantially perpendicular to the sample surface, metal atoms are arranged in a triangular or hexagonal configuration in the crystal parts. However, there is no regularity of arrangement of metal atoms between different crystal parts.

When a CAAC-OS film, e.g., a CAAC-OS film including an $InGaZnO_4$ crystal, is subjected to structural analysis by an out-of-plane method with an X-ray diffraction (XRD) apparatus, a peak appears frequently at a diffraction angle ($2\theta$) of around 31°. This peak is derived from the (009) plane of the $InGaZnO_4$ crystal, which indicates that crystals in the CAAC-OS film have c-axis alignment, and that the c-axes are aligned in a direction substantially perpendicular to the formation surface or the top surface of the CAAC-OS film.

When the CAAC-OS film with an $InGaZnO_4$ crystal is analyzed by an out-of-plane method, a peak may also be observed at $2\theta$ of around 36° as well as at $2\theta$ of around 31°. The peak at $2\theta$ of around 36° indicates that a crystal having no c-axis alignment is included in the CAAC-OS film. It is preferred that in the CAAC-OS film, a peak appear at $2\theta$ of around 31° and a peak not appear at $2\theta$ of around 36°.

The CAAC-OS film is an oxide semiconductor film having low impurity concentration. The impurity is an element other than the main components of the oxide semiconductor film, such as hydrogen, carbon, silicon, or a transition metal element. An element that has higher bonding strength to oxygen than a metal element included in the oxide semiconductor film, such as silicon, disturbs the atomic arrangement of the oxide semiconductor film by depriving the oxide semiconductor film of oxygen and causes a decrease in crystallinity. A heavy metal such as iron or nickel, argon, carbon dioxide, or the like has a large atomic radius (molecular radius), and thus disturbs the atomic arrangement of the oxide semiconductor film and causes a decrease in crystallinity when it is contained in the oxide semiconductor film. The impurity contained in the oxide semiconductor film may serve as a carrier trap or a carrier generation source.

The CAAC-OS film is an oxide semiconductor film having a low density of defect states. In some cases, oxygen vacancies in the oxide semiconductor film serve as carrier traps or serve as carrier generation sources when hydrogen is captured therein.

The state in which the impurity concentration is low and the density of defect states is low (the number of oxygen vacancies is small) is referred to as a "highly purified intrinsic" or "substantially highly purified intrinsic" state. A highly purified intrinsic or substantially highly purified intrinsic oxide semiconductor film has few carrier generation sources, and thus can have a low carrier density. Consequently, a transistor including such an oxide semiconductor film rarely has negative threshold voltage (rarely has normally-on characteristics). The highly purified intrinsic or substantially highly purified intrinsic oxide semiconductor film has few carrier traps; therefore, the transistor including the oxide semiconductor film has little variation in electrical characteristics and high reliability. Note that charge trapped by the carrier traps in an oxide semiconductor film requires a long time to be released and might behave like fixed charge. Thus, a transistor including an oxide semiconductor film having high impurity concentration and a high density of defect states has unstable electrical characteristics in some cases.

With the use of the CAAC-OS film in a transistor, variation in the electrical characteristics of the transistor due to irradiation with visible light or ultraviolet light is small.

Next, a microcrystalline oxide semiconductor film is described.

In a high-resolution TEM image of the microcrystalline oxide semiconductor film, there are a region where a crystal part is observed and a region where a crystal part is not clearly observed. In most cases, a crystal part in the microcrystalline oxide semiconductor film is greater than or equal to 1 nm and less than or equal to 100 nm, or greater than or equal to 1 nm and less than or equal to 10 nm. A microcrystal with a size greater than or equal to 1 nm and less than or equal to 10 nm, or greater than or equal to 1 nm and less than or equal to 3 nm is specifically referred to as a nanocrystal (nc). An oxide semiconductor film including nanocrystal is referred to as a nanocrystalline oxide semiconductor (nc-OS) film. For example, in a high-resolution TEM image of the nc-OS film, a grain boundary is not clearly observed in some cases.

In the nc-OS film, a microscopic region (e.g., a region with a size greater than or equal to 1 nm and less than or equal to 10 nm, in particular, a region with a size greater than or equal to 1 nm and less than or equal to 3 nm) has a periodic atomic arrangement. There is no regularity of crystal orientation between different crystal parts in the nc-OS film. Thus, the orientation of the whole film is not observed. Accordingly, in some cases, the nc-OS film cannot be distinguished from an amorphous oxide semiconductor film depending on an analysis method. For example, when the nc-OS film is subjected to structural analysis by an out-of-plane method with an XRD apparatus using an X-ray having a diameter larger than the diameter of a crystal part, a peak indicating a crystal plane does not appear. Furthermore, a halo pattern is shown in a selected-area electron diffraction pattern of the nc-OS film obtained by using an electron beam having a probe diameter (e.g., 50 nm or larger) larger than the diameter of a crystal part. Meanwhile, spots are shown in a nanobeam electron diffraction pattern of the nc-OS film obtained by using an electron beam having a probe diameter close to or smaller than the size of a crystal part. Furthermore, in a nanobeam electron diffraction pattern of the nc-OS film, regions with high luminance in a circular (ring) pattern are shown in some cases. Moreover, in a nanobeam electron diffraction pattern of the nc-OS film, a plurality of spots are shown in a ring-like region in some cases.

The nc-OS film is an oxide semiconductor film that has higher regularity than an amorphous oxide semiconductor film, and therefore has a lower density of defect states than an amorphous oxide semiconductor film. However, there is no regularity of crystal orientation between different crystal parts in the nc-OS film; hence, the nc-OS film has a higher density of defect states than the CAAC-OS film.

Next, an amorphous oxide semiconductor film is described.

The amorphous oxide semiconductor film has disordered atomic arrangement and no crystal part. An example of the amorphous oxide semiconductor film is an oxide semiconductor film with a non-crystalline state like quartz glass.

In a high-resolution TEM image of the amorphous oxide semiconductor film, crystal parts are not observed.

When the amorphous oxide semiconductor film is subjected to structural analysis by an out-of-plane method with an XRD apparatus, a peak showing a crystal plane does not appear. A halo pattern is shown in an electron diffraction pattern of the amorphous oxide semiconductor film. Furthermore, a halo pattern is shown but any spot is not shown in a nanobeam electron diffraction pattern of the amorphous oxide semiconductor film.

Note that an oxide semiconductor film may have a structure having physical properties between the nc-OS film and the amorphous oxide semiconductor film. The oxide semiconductor film having such a structure is specifically referred to as an amorphous-like oxide semiconductor (a-like OS) film.

In a high-resolution TEM image of the a-like OS film, a void is sometimes observed. Furthermore, in the high-resolution TEM image, there are a region where a crystal part is clearly observed and a region where a crystal part is not observed. In the a-like OS film, crystallization occurs due to a slight amount of electron beam used for TEM observation and growth of the crystal part is found in some cases. In contrast, crystallization is scarcely observed in the nc-OS film having good quality when the electron-beam irradiation is carried out at a low intensity as in the TEM observation.

Note that the crystal part size in the a-like OS film and the nc-OS film can be measured using high-resolution TEM images. For example, an $InGaZnO_4$ crystal has a layered structure in which two Ga—Zn—O layers are included between In—O layers. A unit cell of the $InGaZnO_4$ crystal has a structure in which nine layers including three In—O layers and six Ga—Zn—O layers are stacked in the c-axis direction. Accordingly, the distance between the adjacent layers is equivalent to the lattice spacing on the (009) plane (also referred to as d value). The value is calculated to be 0.29 nm from crystal structural analysis. Thus, focusing on lattice fringes in the high-resolution TEM image, each of lattice fringes in which the lattice spacing therebetween is greater than or equal to 0.28 nm and less than or equal to 0.30 nm corresponds to the a-b plane of the $InGaZnO_4$ crystal.

The density of an oxide semiconductor film varies with its structure in some cases. For example, when the composition of an oxide semiconductor film becomes clear, the structure of the oxide semiconductor film can be estimated from density comparison between the oxide semiconductor film and a single crystal oxide semiconductor film having the same composition as the oxide semiconductor film. For example, the density of an a-like OS film is higher than or equal to 78.6% and lower than 92.3% of the density of a single crystal oxide semiconductor having the same composition. For example, the density of each of an nc-OS film and a CAAC-OS film is higher than or equal to 92.3% and lower than 100% of the density of a single crystal oxide semiconductor having the same composition. Note that it is difficult to deposit an oxide semiconductor film whose density is lower than 78% of the density of the single crystal oxide semiconductor film.

Specific examples of the above description are given. For example, in an oxide semiconductor film with an atomic ratio of In:Ga:Zn=1:1:1, the density of single crystal $InGaZnO_4$ with a rhombohedral crystal structure is 6.357 $g/cm^3$. Thus, for example, the density of an a-like OS film with an atomic ratio of In:Ga:Zn=1:1:1 is higher than or equal to 5.0 $g/cm^3$ and lower than 5.9 $g/cm^3$. Moreover, for example, the density of an nc-OS film or a CAAC-OS film with an atomic ratio of In:Ga:Zn=1:1:1 is higher than or equal to 5.9 $g/cm^3$ and lower than 6.3 $g/cm^3$.

Note that single crystals with the same composition do not exist in some cases. In such a case, combining single crystals with different compositions at a given proportion makes it possible to calculate a density that corresponds to the density of a single crystal with a desired composition. The density of the single crystal with a desired composition can be calculated using weighted average with respect to the combination ratio of the single crystals with different compositions. Note that it is preferable to combine as few kinds of single crystals as possible for density calculation.

Note that an oxide semiconductor film may be a stacked film including two or more films of an amorphous oxide semiconductor film, an a-like OS film, a microcrystalline oxide semiconductor film, and a CAAC-OS film, for example.

As described above, the OS transistor can achieve extremely favorable off-state current characteristics.

Embodiment 3

In this embodiment, a cross-sectional structure of a transistor included in a semiconductor device of one embodiment of the disclosed invention will be described with reference to drawings.

<Schematic Views of Cross-Sectional Structure>

First, schematic views of a cross-sectional structure of the semiconductor device of one embodiment of the present invention will be described with reference to FIGS. 16A and 16B.

Transistors included in the semiconductor device of one embodiment of the present invention are Si transistors and OS transistors. For example, the semiconductor device has a cross-sectional structure in which a layer including Si transistors and a layer including OS transistors are stacked. Each of the layers includes a plurality of transistors including a semiconductor layer of the same material.

Figure 16A:
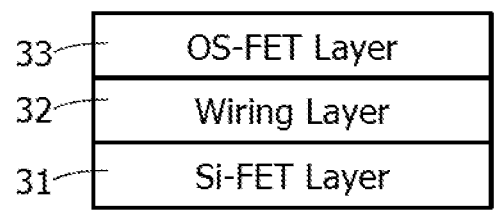
FIGS. 16A and 16B are schematic cross-sectional views for describing a semiconductor device.

For example as illustrated in FIG. 16A, the semiconductor device of one embodiment of the present invention can be formed by stacking a layer 31 including Si transistors (represented as Si-FET Layer in FIG. 16A), a layer 32 where wirings are provided (represented as Wiring Layer in FIG. 16A), and a layer 33 including OS transistors (represented as OS-FET Layer in FIG. 16A) in this order.

The Si-FET layer 31 in the schematic view of the cross-sectional structure in FIG. 16A includes Si transistors formed on a single crystal silicon substrate. Note that the Si transistors may be transistors including a thin semiconductor layer of silicon, germanium, or the like in an amorphous, microcrystalline, polycrystalline, or single crystal state.

The OS-FET layer 33 in the schematic view of the cross-sectional structure in FIG. 16A includes OS transistors formed on a planarized insulating surface.

The wiring layer 32 in the schematic view of the cross-sectional structure in FIG. 16A includes a wiring for electrically connecting transistors in the Si-FET layer 31 and/or the OS-FET layer 33, or includes a wiring for supplying voltage to the transistors. Although the wiring layer 32 is shown as a single layer in FIG. 16A, a plurality of layers 32 may be provided.

The OS-FET layer 33 is illustrated as a single layer in the schematic view of the cross-sectional structure in FIG. 16A. Alternatively, a plurality of OS-FET layers 33 may be provided; FIG. 16B is a schematic view of a cross-sectional structure in that case.

Figure 16B:
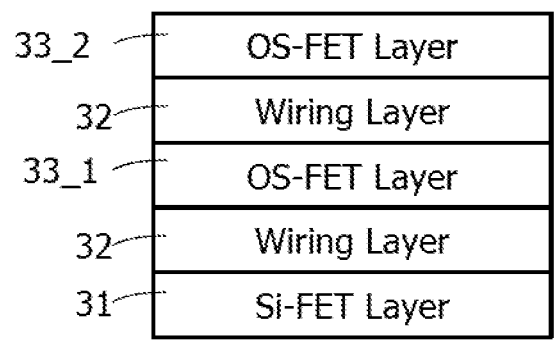

FIG. 16B illustrates a two-layer structure including a layer 33_1 including OS transistors (hereinafter referred to as OS-FET layer 33_1) and a layer 33_2 including OS transistors (hereinafter referred to as OS-FET layer 33_2). In the schematic view of the cross-sectional structure in FIG. 16B, the OS-FET layer 33_1 and the OS-FET layer 33_2 include OS transistors formed on a planarized insulating surface. Although the example of stacking two layers is shown in FIG. 16B, the number of stacked layers is not limited to two. The wiring layer 32 can be provided between the OS-FET layer 33_1 and the OS-FET layer 33_2. With this structure, the OS transistors can be electrically connected to each other.

The transistors M1a and M2a (M1b and M2b) described in FIG. 4 of Embodiment 1 are OS transistors and the transistor M3a (M3b) is a Si transistor. Thus, when the transistors in FIG. 4 are provided in the layers in FIGS. 16A and 16B, the transistor M3a (M3b) is provided in the Si-FET layer 31 and the transistors M1a and M2a (M1b and M2b) are provided in the OS-FET layers 33, 33_1, and 33_2. Stacking the layer including OS transistors (OS-FET layer) over the layer including Si transistors (Si-FET layer) as illustrated in FIGS. 16A and 16B enables a reduction in the circuit area of a memory cell, that is, a reduction in the chip area and size of the semiconductor device.

<Cross-Sectional Structure of Layer Including Si Transistors and Layer where Wirings are Provided>

Figure 17:
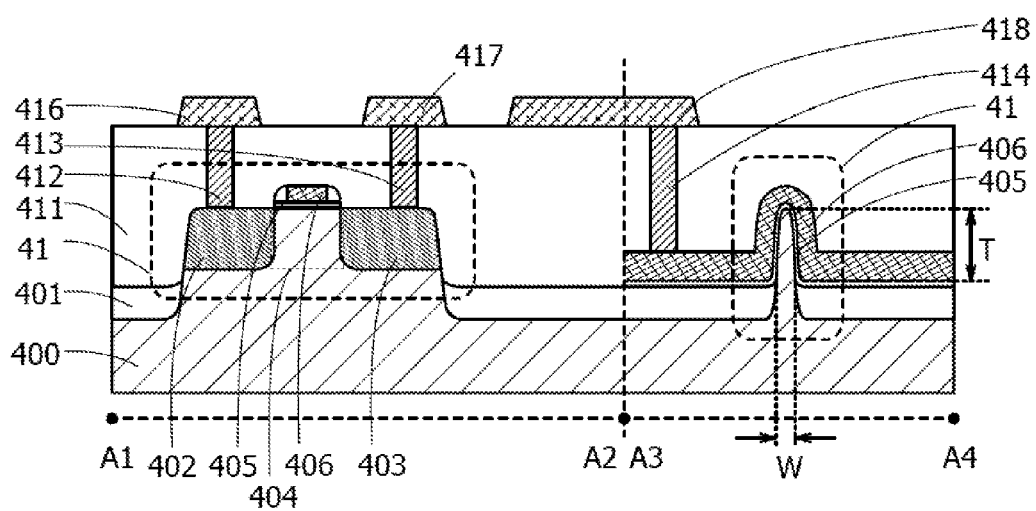
FIG. 17 is a schematic cross-sectional view for describing a semiconductor device.

FIG. 17 illustrates an example of a cross-sectional structure of the Si-FET layer 31 and the wiring layer 32, which are described with reference to FIGS. 16A and 16B. FIG. 17 specifically shows a cross-sectional structure of a transistor 41 included in the Si-FET layer 31. The cross-sectional structure of the transistor 41 in FIG. 17 can be applied to the transistor M3a (M3b) illustrated in FIG. 4 of Embodiment 1, for example.

In FIG. 17, a region along the dashed line A1-A2 shows the structure of the transistor 41 in the channel length direction, and a region along the dashed line A3-A4 shows the structure of the transistor 41 in the channel width direction.

In FIG. 17, a substrate 400 where the transistor 41 is formed can be, for example, a silicon substrate, a germanium substrate, or a silicon germanium substrate. FIG. 17 illustrates an example where a single crystal silicon substrate is used as the substrate 400.

The transistor 41 is electrically isolated by an element isolation method. An example of the element isolation method is a trench isolation method (shallow trench isolation: STI). FIG. 17 illustrates an example where the trench isolation method is used to electrically isolate the transistor 41. Specifically, in FIG. 17, the transistor 41 is electrically isolated by using an element isolation region 401 formed in such a manner that an insulator containing silicon oxide or the like is buried in a trench formed in the substrate 400 by etching or the like and then the insulator is removed partly by etching or the like.

In a projection of the substrate 400 that exists in a region other than the trench, an impurity region 402 and an impurity region 403 of the transistor 41 and a channel formation region 404 placed between the impurity regions 402 and 403 are provided. The transistor 41 also includes an insulating film 405 covering the channel formation region 404 and a gate electrode 406 that overlaps the channel formation region 404 with the insulating film 405 placed therebetween.

In the transistor 41, the gate electrode 406 overlaps a side portion and an upper portion of the projection in the channel formation region 404, with the insulating film 405 positioned therebetween; thus, carriers flow in a wide area including a side portion and an upper portion of the channel formation region 404. Accordingly, the number of transferred carriers in the transistor 41 can be increased while an area over the substrate occupied by the transistor 41 is kept small. As a result, the on-state current and field-effect mobility of the transistor 41 are increased. Suppose the length of the projection of the channel formation region 404 in the channel width direction (i.e., channel width) is W and the thickness of the projection of the channel formation region 404 is T. When the aspect ratio of the thickness T to the channel width W is high, a region where carrier flows becomes wider. Thus, the on-state current of the transistor 41 can be further increased and the field-effect mobility of the transistor 41 can be further increased.

Note that when the transistor 41 is formed using a bulk semiconductor substrate, the aspect ratio is preferably 0.5 or higher, more preferably 1 or higher.

An insulating film 411 is provided over the transistor 41. Openings are formed in the insulating film 411. Conductive films 412 and 413 that are electrically connected to the impurity regions 402 and 403, respectively, and a conductive film 414 that is electrically connected to the gate electrode 406 are formed in the openings.

The conductive film 412 is electrically connected to a conductive film 416 over the insulating film 411. The conductive film 413 is electrically connected to a conductive film 417 over the insulating film 411. The conductive film 414 is electrically connected to a conductive film 418 over the insulating film 411.

Note that the wiring layer 32 illustrated in FIGS. 16A and 16B corresponds to the conductive films 416, 417, and 418 in FIG. 17. The wiring layer 32 can be stacked by forming an insulating film, an opening in the insulating film, and a conductive film in a region including the opening, in this order.

<Cross-Sectional Structure of Layer Including OS Transistors>

Figure 18A:
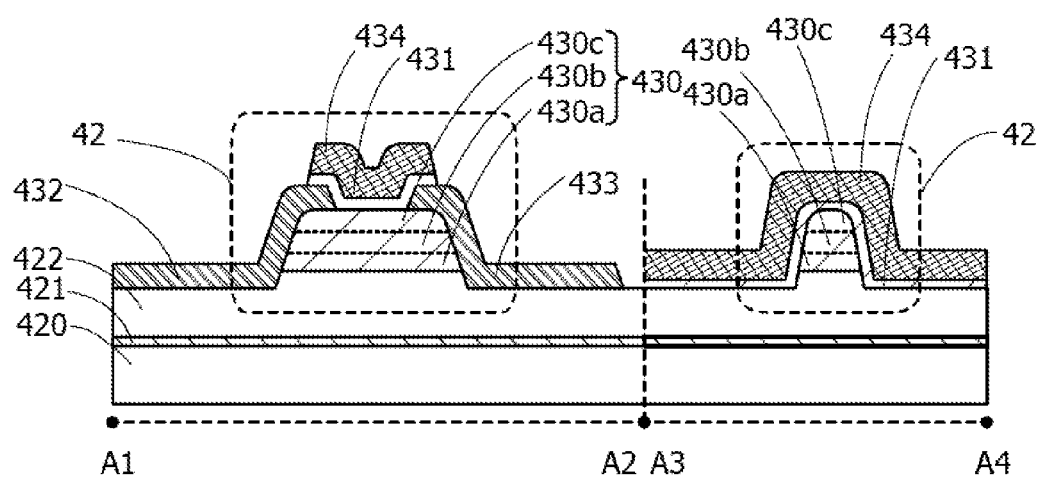
FIGS. 18A and 18B are schematic cross-sectional views for describing a semiconductor device.
Figure 18B:
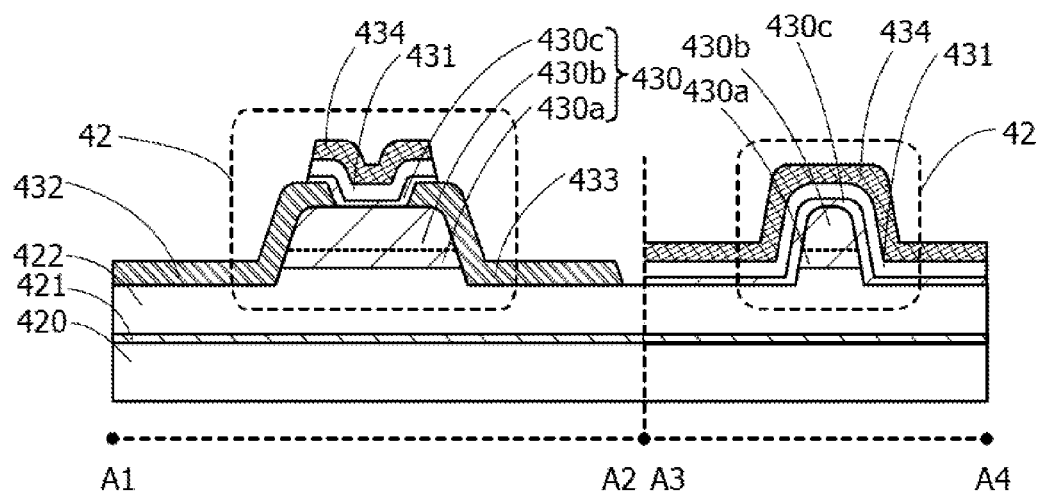

Next, FIGS. 18A and 18B illustrate an example of a cross-sectional structure of the OS-FET layer 33 described using FIGS. 16A and 16B. FIGS. 18A and 18B each specifically show a cross-sectional structure of a transistor 42 included in the OS-FET layer 33. The cross-sectional structures of the transistor 42 in FIGS. 18A and 18B can be applied to the transistors M1a and M2a (M1b and M2b) illustrated in FIG. 4 of Embodiment 1, for example.

In FIGS. 18A and 18B, as in FIG. 17, a region along the dashed line A1-A2 shows the structure of the transistor 42 in the channel length direction, and a region along the dashed line A3-A4 shows the structure of the transistor 42 in the channel width direction.

An insulating film 421 having a blocking effect of preventing diffusion of oxygen, hydrogen, and water is provided over an insulating film 420 that is provided over the wiring layer 32 described using FIGS. 16A and 16B. As the insulating film 421 has higher density and is denser or has a fewer dangling bonds and is more chemically stable, the insulating film 421 has a higher blocking effect. The insulating film 421 with an effect of blocking diffusion of oxygen, hydrogen, and water can be formed using aluminum oxide, aluminum oxynitride, gallium oxide, gallium oxynitride, yttrium oxide, yttrium oxynitride, hafnium oxide, or hafnium oxynitride, for example. The insulating film 421 with an effect of blocking diffusion of hydrogen and water can be formed using silicon nitride or silicon nitride oxide, for example.

An insulating film 422 is provided over the insulating film 421, and the transistor 42 is provided over the insulating film 422.

The transistor 42 includes, over the insulating film 422, a semiconductor film 430 containing an oxide semiconductor, conductive films 432 and 433 that function as source and drain electrodes and are electrically connected to the semiconductor film 430, a gate insulating film 431 covering the semiconductor film 430, and a gate electrode 434 overlapping the semiconductor film 430 with the gate insulating film 431 positioned therebetween.

Note that in FIG. 18A, the transistor 42 includes the gate electrode 434 on at least one side of the semiconductor film 430, and may also include a gate electrode that overlaps with the semiconductor film 430 with the insulating film 422 positioned therebetween.

When the transistor 42 includes a pair of gate electrodes, one of the gate electrodes may be supplied with a signal for controlling the on/off state, and the other of the gate electrodes may be supplied with a voltage from another wiring. In this case, voltages with the same level may be supplied to the pair of gate electrodes, or a fixed voltage such as the ground voltage may be supplied only to the other of the gate electrodes. By controlling a voltage supplied to the other of the gate electrodes, the threshold voltage of the transistor can be controlled.

In FIG. 18A, the transistor 42 has a single-gate structure where one channel formation region corresponding to one gate electrode 434 is provided. Alternatively, the transistor 42 may have a multi-gate structure where a plurality of gate electrodes electrically connected to each other are provided so that a plurality of channel formation regions are included in one active layer.

FIG. 18A illustrates an example in which the semiconductor film 430 included in the transistor 42 includes oxide semiconductor films 430a to 430c that are stacked in this order over the insulating film 422. Note that in one embodiment of the present invention, the semiconductor film 430 of the transistor 42 may be a single metal oxide film.

When the oxide semiconductor film 430b is an In—M—Zn oxide film (M is Ga, Y, Zr, La, Ce, or Nd) and a target having the atomic ratio of metal elements of In:M:Zn=$x_1$:$y_1$:$z_1$ is used to form the oxide semiconductor film 430b, $x_1/y_1$ is preferably greater than or equal to ⅓ and less than or equal to 6, further preferably greater than or equal to 1 and less than or equal to 6, and $z_1/y_1$ is preferably greater than or equal to ⅓ and less than or equal to 6, further preferably greater than or equal to 1 and less than or equal to 6. Note that when $z_1/y_1$ is greater than or equal to 1 and less than or equal to 6, a CAAC-OS film is easily formed as the oxide semiconductor film 430b. Typical examples of the atomic ratio of the metal elements of the target are In:M:Zn=1:1:1 and 3:1:2.

When the oxide semiconductor films 430a and 430c are In—M—Zn oxide films (M represents Ga, Y, Zr, La, Ce, or Nd) and a target having the atomic ratio of metal elements of In:M:Zn=$x_2$:$y_2$:$z_2$ is used to form the oxide semiconductor films 430a and 430c, $x_2/y_2$ is preferably less than $x_1/y_1$, and $z_2/y_2$ is preferably greater than or equal to ⅓ and less than or equal to 6, further preferably greater than or equal to 1 and less than or equal to 6. Note that when $z_2/y_2$ is greater than or equal to 1 and less than or equal to 6, CAAC-OS films are easily formed as the oxide semiconductor films 430a and 430c. Typical examples of the atomic ratio of the metal elements of the target are In:M:Zn=1:3:2, 1:3:4, and 1:3:6.

The insulating film 422 preferably has a function of supplying part of oxygen contained therein to the oxide semiconductor films 430a to 430c by heating. The insulating film 422 preferably has few defects, and typically, the spin density at g=2.001 due to a dangling bond of silicon is preferably lower than or equal to $1 \times 10^{18}$ spins/cm$^3$ when measured by electron spin resonance (ESR) spectroscopy.

The insulating film 422, which has a function of supplying part of oxygen contained therein to the oxide semiconductor films 430a to 430c by heating, is preferably oxide. Examples of the oxide include aluminum oxide, magnesium oxide, silicon oxide, silicon oxynitride, silicon nitride oxide, gallium oxide, germanium oxide, yttrium oxide, zirconium oxide, lanthanum oxide, neodymium oxide, hafnium oxide, and tantalum oxide. The insulating film 422 can be formed by a plasma chemical vapor deposition (CVD) method, a sputtering method, or the like.

Note that in this specification, oxynitride refers to a material that contains more oxygen than nitrogen, and nitride oxide refers to a material that contains more nitrogen than oxygen.

Note that in the transistor 42 illustrated in FIG. 18A, the gate electrode 434 overlaps end portions of the oxide semiconductor film 430b including a channel region that do not overlap with the conductive films 432 and 433, i.e., end portions of the oxide semiconductor film 430b that are in a region different from a region where the conductive films 432 and 433 are located. When the end portions of the oxide semiconductor film 430b are exposed to plasma by etching for forming the end portions, a chlorine radical, a fluorine radical, or the like generated from an etching gas are easily bonded to a metal element contained in an oxide semiconductor. For this reason, in the end portions of the oxide semiconductor film, oxygen bonded to the metal element is easily eliminated; thus, it is possible that an oxygen vacancy is easily formed and the oxide semiconductor film easily has n-type conductivity. However, in the transistor 42 of FIG. 18A, an electric field applied to the end portions can be controlled by controlling the voltage of the gate electrode 434 because the end portions of the oxide semiconductor film 430b that do not overlap with the conductive films 432 and 433 overlap with the gate electrode 434. Consequently, current that flows between the conductive films 432 and 433 through the end portions of the oxide semiconductor film 430b can be controlled by the voltage applied to the gate electrode 434. Such a structure of the transistor 42 is referred to as a surrounded channel (s-channel) structure.

With the s-channel structure, when a voltage at which the transistor 42 is turned off is supplied to the gate electrode 434, the amount of off-state current that flows between the conductive films 432 and 433 through the end portions of the oxide semiconductor film 430b can be reduced. For this reason, even when the distance between the conductive films 432 and 433 at the end portions of the oxide semiconductor film 430b is reduced in the transistor 42 as a result of decreasing the channel length to obtain high on-state current, the transistor 42 can have low off-state current. Consequently, with a short channel length, the transistor 42 can have high on-state current and low off-state current.

With the s-channel structure, specifically, when a voltage at which the transistor 42 is turned on is supplied to the gate electrode 434, the amount of current that flows between the conductive films 432 and 433 through the end portions of the oxide semiconductor film 430b can be increased. The current contributes to an increase in the field-effect mobility and the on-state current of the transistor 42. When the end portions of the oxide semiconductor film 430b overlap with the gate electrode 434, carriers flow in a wide region of the oxide semiconductor film 430b without being limited to a region in the vicinity of the interface between the oxide semiconductor film 430b and the gate insulating film 431, which results in an increase in carrier mobility of the transistor 42. As a result, the on-state current of the transistor 42 is increased, and the field-effect mobility is increased to greater than or equal to 10 cm$^2$/V·s or to greater than or equal to 20 cm$^2$/V·s, for example. Note that here, the field-effect mobility is not an approximate value of the mobility as the physical property of the oxide semiconductor film but is the apparent field-effect mobility in a saturation region of the transistor, which is an index of current drive capability.

Note that FIG. 18A illustrates the structure where the semiconductor film 430 in the transistor 42 includes the oxide semiconductor films 430a to 430c stacked in this order. The semiconductor film 430 may also have a structure illustrated in FIG. 18B. As illustrated in FIG. 18B, the oxide semiconductor film 430c included in the semiconductor film 430 may be provided over the conductive films 432 and 433 and overlap with the gate insulating film 431.

<Cross-Sectional Structure of Stack of Layer Including Si Transistors and Layer Including OS Transistors>

Next, FIGS. 16 to 19 illustrate examples of a cross-sectional structure of stacking the Si-FET layer 31 and the wiring layer 32 are provided, described with FIG. 17, and the OS-FET layer 33, described with FIG. 18A.

Figure 19:
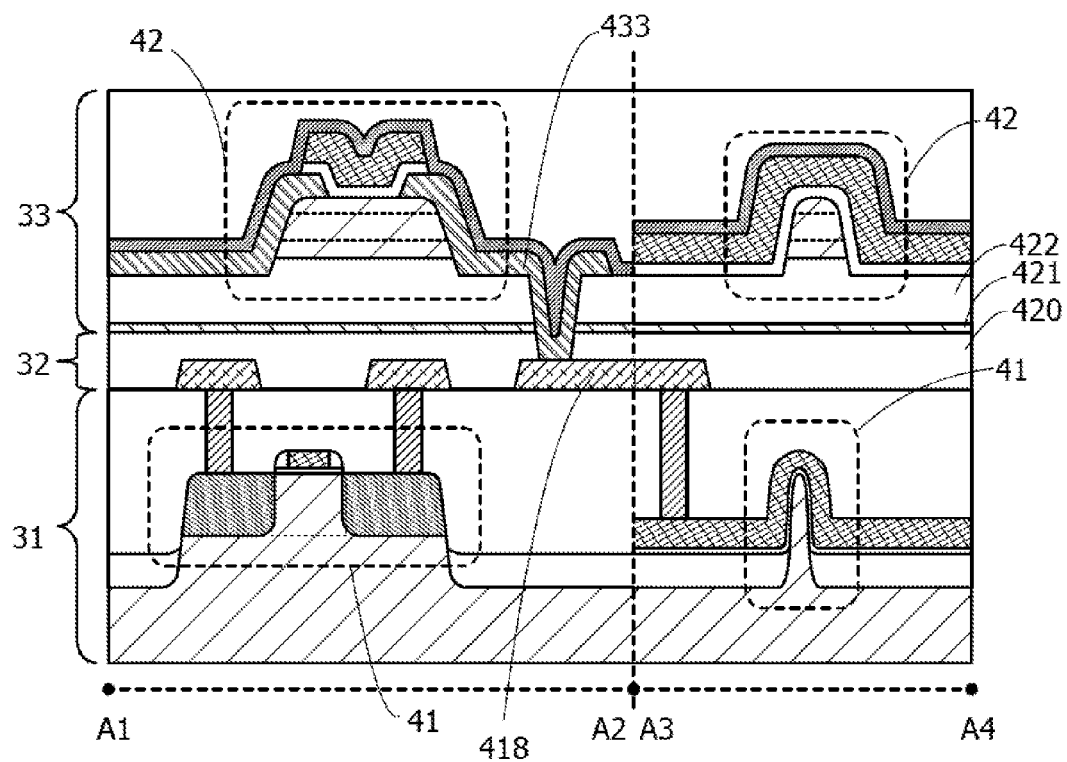
FIG. 19 is a schematic cross-sectional view for describing a semiconductor device.

FIG. 19 illustrates an example of a cross-sectional structure corresponding to the schematic view in FIG. 16A.

In FIG. 19, as in FIG. 17 and FIGS. 18A and 18B, a region along the dashed line A1-A2 shows the structure of the transistors 41 and 42 in the channel length direction, and a region along the dashed line A3-A4 shows the structure of the transistors 41 and 42 in the channel width direction.

Note that unlike in FIG. 19, the channel length direction of the transistor 41 and that of the transistor 42 may not be necessarily consistent with each other in one embodiment of the present invention.

In FIG. 19, an opening is provided in the insulating films 420 to 422 to electrically connect the transistor 41 and the transistor 42. The conductive film 433 provided in the opening is connected to the conductive film 418 through the opening.

In the cross-sectional structure illustrated in FIG. 19, as has been described for FIG. 16A, the transistor 42 including a channel formation region in an oxide semiconductor film is formed over the transistor 41 including a channel formation region in a single crystal silicon substrate. With the structure illustrated in FIG. 19, the channel formation region of the transistor 42 can overlap the channel formation region of the transistor 41. Accordingly, a semiconductor device including a memory cell with such a structure can have a reduced layout area.

Note that when the transistor 42 provided in the OS-FET layer 33 is used as the transistors M1a and M2a (M1b and M2b) illustrated in FIG. 4 of Embodiment 1, the transistors M1a and M2a (M1b and M2b) may be provided in the same layer or different layers.

Figure 20:
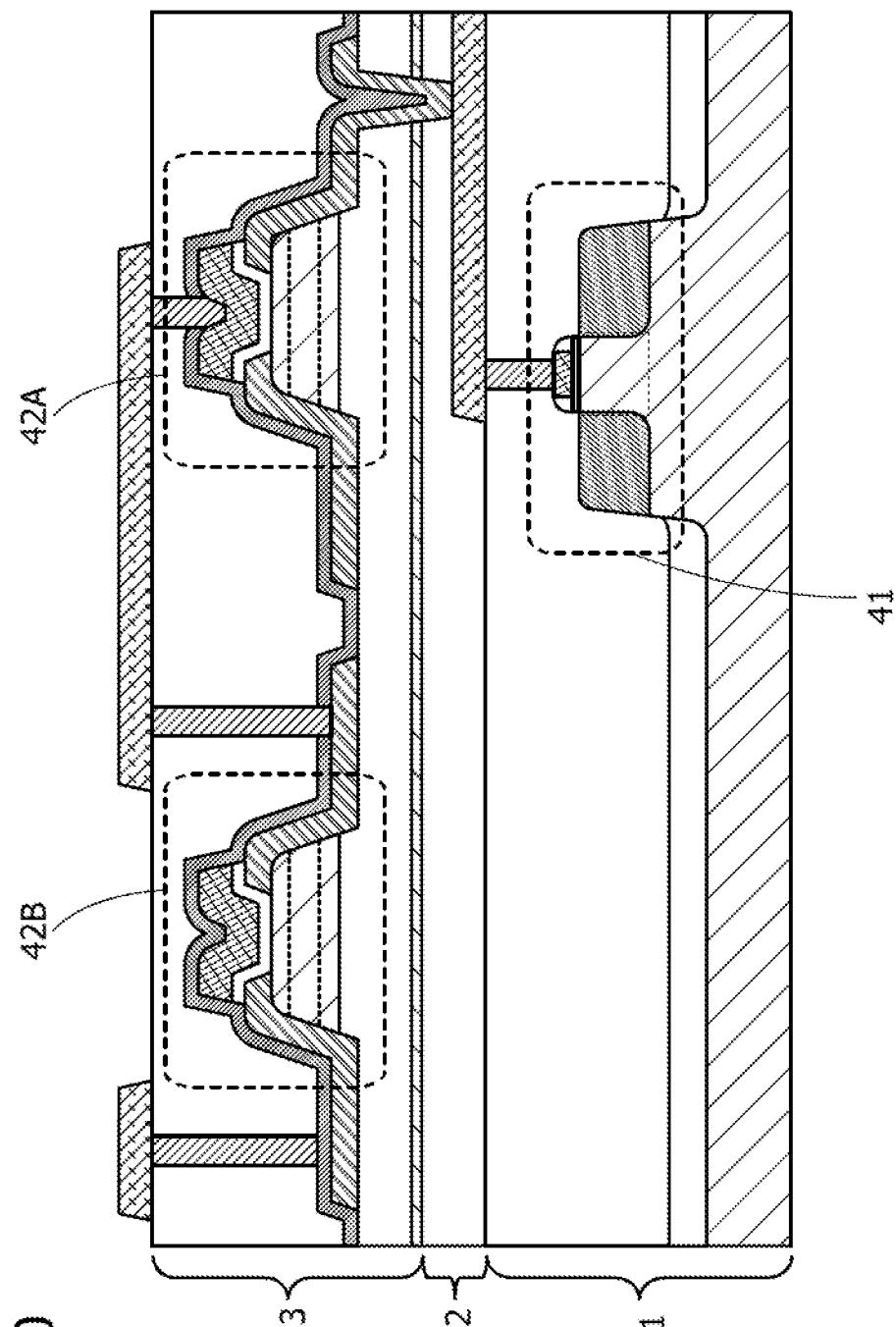
FIG. 20 is a schematic cross-sectional view for describing a semiconductor device.

For example, to provide a plurality of transistors 42 in one OS-FET layer 33, a structure illustrated in FIG. 20 can be employed. To provide a plurality of transistors 42 in different OS-FET layers 33, a structure illustrated in FIG. 21 can be employed in which the OS-FET layer 33_1 and the OS-FET layer 33_2 are stacked with the wiring layer 32 placed therebetween.

In the case of employing the cross-sectional structure in FIG. 20, even when the number of OS transistors is increased, only one OS-FET layer 33 is required. Thus, the number of stacked layers is not increased. For example, the transistor 42A and the transistor 42B in FIG. 20 can be concurrently formed. Accordingly, the number of steps for manufacturing a semiconductor device can be reduced.

FIG. 20 illustrates the structure of the transistors 41, 42A, and 42B in the channel length direction. Their structure in the channel width direction is similar to that illustrated in FIG. 19, and the aforementioned structure can be referred to.

By applying the cross-sectional structure of FIG. 20 to the transistors described in Embodiment 1, the transistors 42A and 42B can be formed as the transistors M1a and M2a (M1b and M2b). Thus, manufacturing cost of the semiconductor devices can be reduced.

Figure 21:
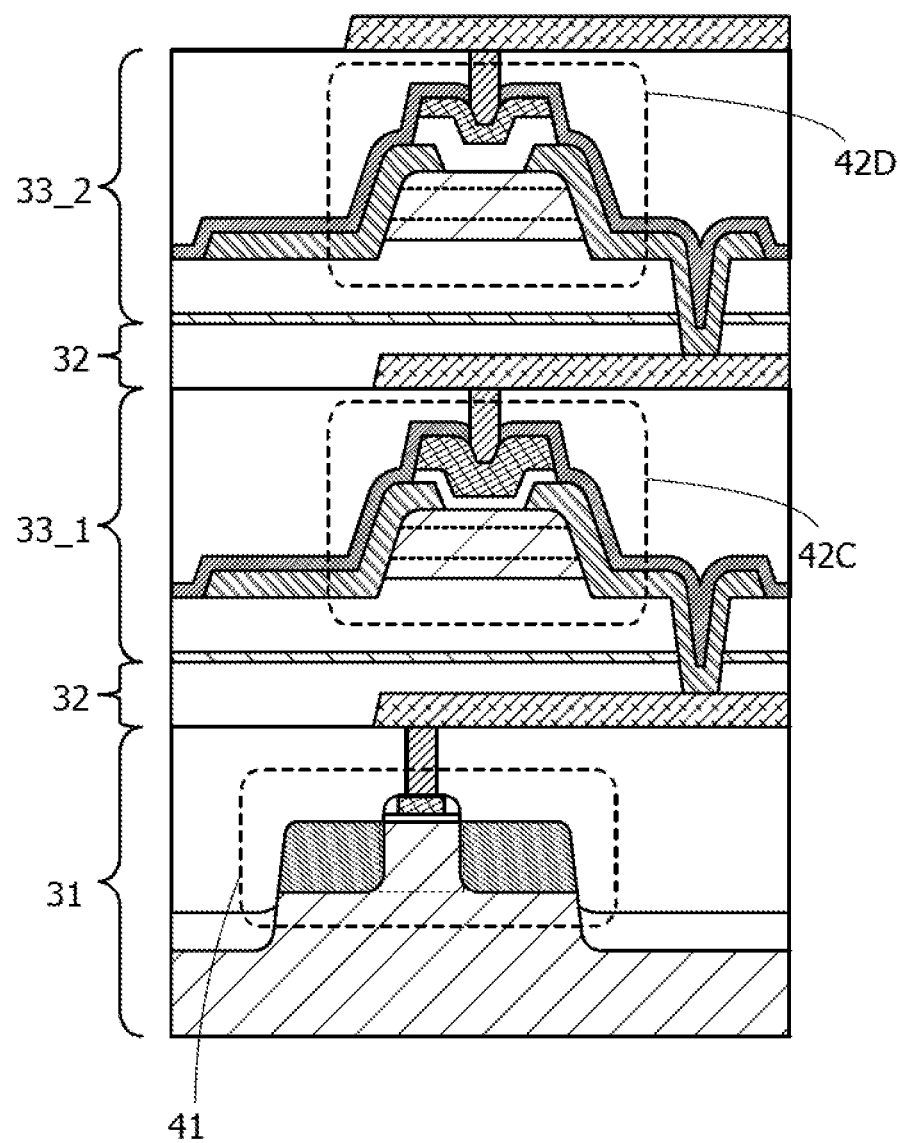
FIG. 21 is a schematic cross-sectional view for describing a semiconductor device.

With the cross-sectional structure in FIG. 21, even when the number of OS transistors is increased, the OS transistors can be provided in a plurality of layers such as the OS-FET layers 33_1 and 33_2. Accordingly, the increase in circuit area due to the increased number of transistors can be prevented. Consequently, the chip area and size of the semiconductor device can be reduced.

FIG. 21 illustrates the structure of the transistor 41, a transistor 42C, and a transistor 42D in the channel length direction. Their structure in the channel width direction is similar to that illustrated in FIG. 19, and the aforementioned structure can be referred to.

By applying the cross-sectional structure of FIG. 21 to the transistors described in Embodiment 1, the transistors 42C and 42D can be formed as the transistors M1a and M2a (M1b and M2b). With the cross-sectional structure in FIG. 21, the film thickness, film quality, or the like in the OS transistors can vary between the OS-FET layer 33_1 and the OS-FET layer 33_2. Thus, transistors with different characteristics can be fabricated separately. For example, transistors with high switching characteristics due to thin gate insulating films and transistors with high breakdown voltage due to thick gate insulating films can be stacked. Accordingly, the semiconductor device can have high performance.

Embodiment 4

Figure 22:
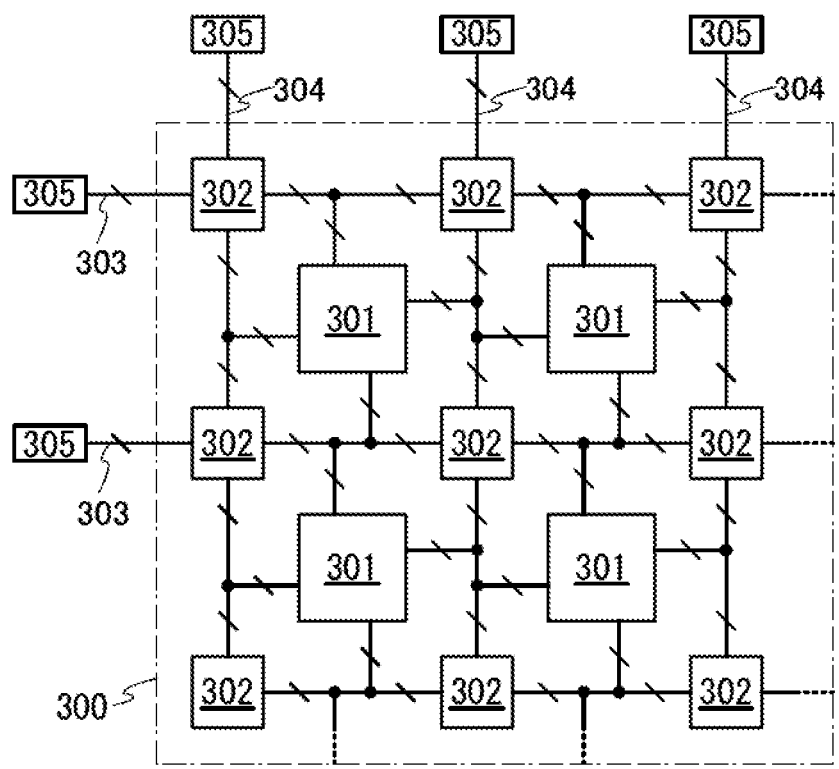
FIG. 22 is a block diagram illustrating a specific example of a semiconductor device.

In this embodiment, an application example of the semiconductor device in a programmable logic device (PLD) is described. FIG. 22 shows an example of a block diagram of a logic array included in a PLD. A logic array 300 includes a plurality of logic elements (LEs) 301 arranged in an array. Here, the expression "arranged in an array" means that the logic elements are arranged in a matrix at regular intervals, and the arrangement is not limited to that illustrated in FIG. 22. A semiconductor device described in this embodiment functions as a register in the PLD.

A plurality of wirings are formed to surround the LEs 301. In FIG. 22, these wirings consist of a plurality of horizontal wiring groups 303 and a plurality of vertical wiring groups 304. A wiring group is a bundle of wirings. A switch portion 302 is provided at an intersection of the horizontal wiring group 303 and the vertical wiring group 304. The horizontal wiring groups 303 and the vertical wiring groups 304 are connected to input/output terminals 305 to transmit and receive signals to and from a circuit provided outside the logic array 300.

Input/output terminals of the plurality of LEs 301 are connected to the horizontal wiring groups 303 and the vertical wiring groups 304 provided around the LEs 301. For example, in FIG. 22, the input/output terminals of the LE 301 are connected to the horizontal wiring groups 303 and the vertical wiring groups 304 on the left, right, top, and bottom sides. With the use of these input/output terminals, each of the LEs 301 can be connected to another LE 301. A connection path between one LE 301 and another LE 301 is determined by a switch provided in the switch portion 302 to switch connection between wirings.

The on/off state of the switch in the switch portion 302 for switching connection between wirings is determined by a configuration memory that stores configuration data. The configuration memory with a rewritable structure, which is provided in the switch portion 302, preferably includes a nonvolatile memory element to prevent stored configuration data from being lost by stop of supply of power supply voltage.

Figure 23:
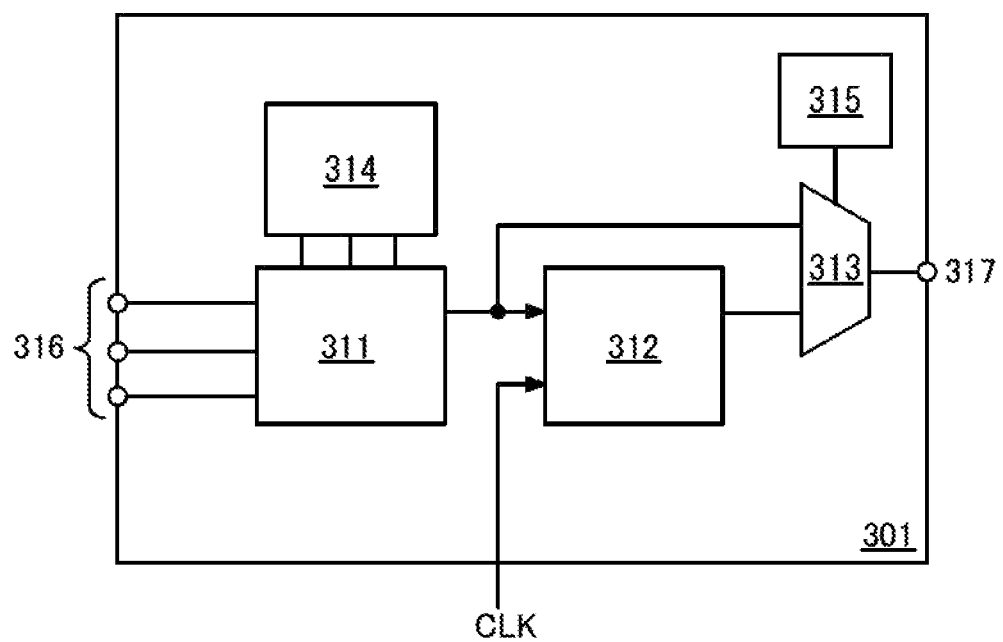
FIG. 23 is a block diagram illustrating a specific example of a semiconductor device.

FIG. 23 is a block diagram of the LE 301 illustrated in FIG. 22. The LE 301 in FIG. 23 includes a lookup table (LUT) 311, a flip-flop 312, and a multiplexer 313, for example. Moreover, configuration memories 314 and 315 connected to the LUT 311 and the multiplexer 313, respectively, are provided in FIG. 23.

The configuration memories 314 and 315 with a rewritable structure each preferably include a nonvolatile memory element to prevent stored configuration data from being lost by stop of supply of power supply voltage.

Configuration data refers to data of the LUT 311, information on selection of input signals of the multiplexer 313, and data on the on/off state of the switch portion 302, for example. A configuration memory refers to a memory element for storing configuration data.

A logic circuit determined by the LUT 311 varies depending on the content of configuration data stored in the configuration memory 314. When the configuration data is determined, one output value of the LUT 311 with respect to input values of a plurality of input signals supplied to input terminals 316 is determined. Then, the LUT 311 outputs a signal including the output value.

The flip-flop 312 holds the signal output from the LUT 311 and outputs an output signal corresponding to the signal to the multiplexer 313 in synchronization with a clock signal CLK.

The output signal from the LUT 311 and the output signal from a flip-flop 312 are input to the multiplexer 313. The multiplexer 313 outputs one of the two output signals in accordance with configuration data held in the configuration memory 315. The output signal from the multiplexer 313 is output from an output terminal 317.

In one embodiment of the present invention, the semiconductor device described in the foregoing embodiment is used for a circuit for temporarily storing data, such as the flip-flop 312, thereby preventing loss of data in the flip-flop caused by stop of the supply of power supply voltage. Furthermore, data held before stop of the supply of power supply voltage can be stored in a short time, and the data can be restored in a short time after the supply of power supply voltage is restarted. Thus, the supply of power supply voltage can be stopped in a plurality of logic elements included in the PLD. Accordingly, power consumption of the PLD can be low.

Embodiment 5

Figure 24:
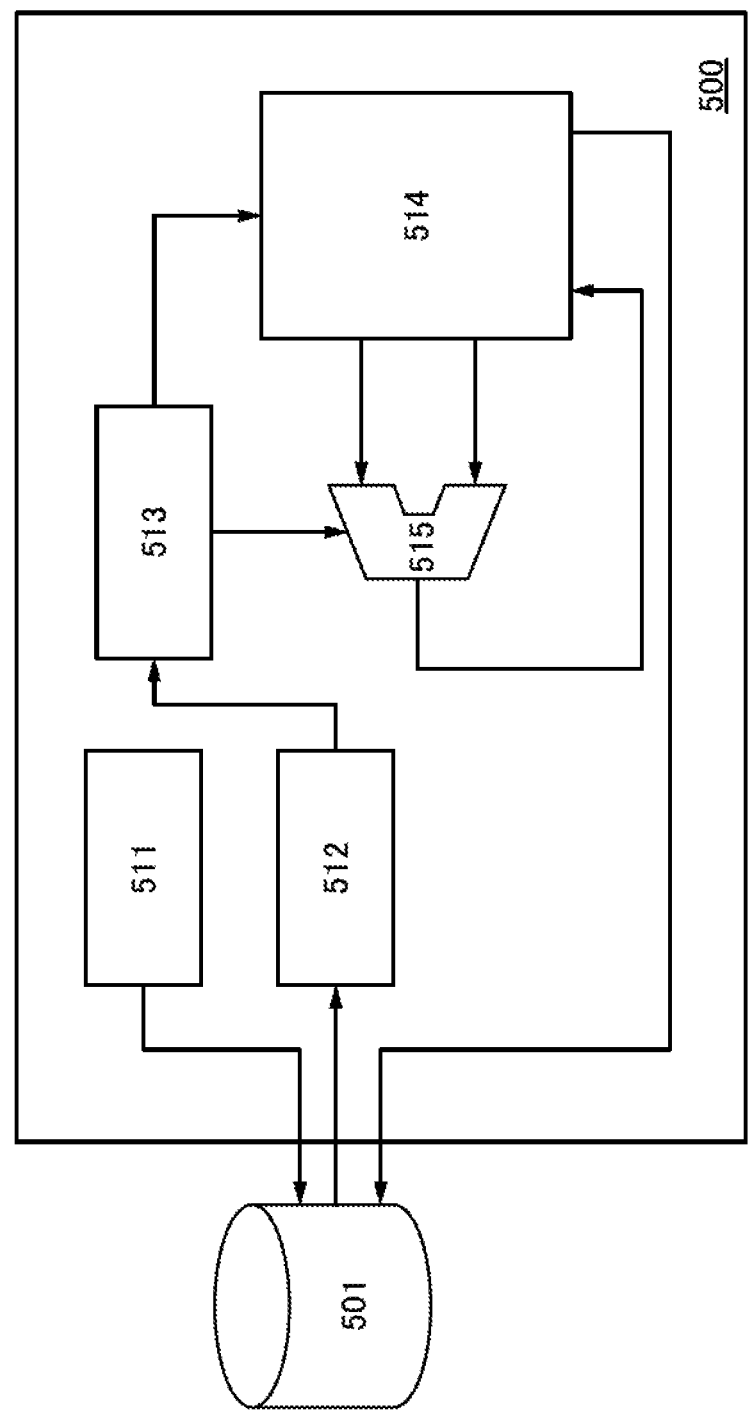
FIG. 24 is a block diagram illustrating a specific example of a semiconductor device.

In this embodiment, an application example of the semiconductor device in a central processing unit (CPU) is described. FIG. 24 illustrates an example of a block diagram of a CPU. A semiconductor device described in this embodiment functions as a register in the CPU.

A CPU 500 includes a program counter 511, an instruction register 512, an instruction decoder 513, a general-purpose register 514, and an arithmetic logic unit (ALU) 515, for example. A main memory device 501 for inputting and outputting data to and from the CPU 500 is provided outside the CPU 500.

The program counter 511 is a register that stores an address of an instruction (command) to be read (fetched). The instruction register 512 temporarily holds data transmitted to the instruction decoder 513 from the main memory device 501. The instruction decoder 513 is a circuit that decodes input data and generates signals for specifying a register in the general-purpose register 514, a signal for specifying an arithmetic method in the ALU 515, and the like. The general-purpose register 514 can hold data read from the main memory device 501, data obtained during arithmetic operations in the ALU 515, data obtained as a result of arithmetic operations in the ALU 515, or the like. The ALU 515 has a function of performing a variety of arithmetic operations such as four arithmetic operations and logic operations. In the CPU 500, a data cache or the like, that is, a circuit for temporarily storing an arithmetic result or the like, may be additionally provided.

Next, the operation of the CPU 500 will be described.

The CPU 500 gives an instruction to output an address of an instruction that is specified by the program counter 511 to be read out, to the main memory device 501. Next, data is read from the address of the instruction to be carried out, which is stored in the main memory device 501, and is stored in the instruction register 512.

The instruction decoder 513 decodes the data stored in the instruction register 512, so that the instruction is executed. Specifically, the instruction decoder 513 generates a signal for specifying a register in the general-purpose register 514, a signal for specifying an arithmetic method in the ALU 515, and the like.

The general-purpose register 514 outputs the data, which is specified by the instruction decoder 513, to the ALU 515 or the main memory device 501 in accordance with the instruction. The ALU 515 carries out arithmetic operations in accordance with an arithmetic method specified by the instruction decoder 513, and an arithmetic result is stored in the general-purpose register 514.

After executing the instruction, the CPU 500 repeats the following operations: reading an instruction, decoding data read from the instruction register 512, and carrying out the instruction.

In one embodiment of the present invention, the semiconductor device shown in the foregoing embodiment is used for registers for temporarily storing data, such as the program counter 511, the instruction register 512, the instruction decoder 513, and the general-purpose register 514, thereby preventing loss of data in the registers caused by stop of the supply of power supply voltage. Furthermore, data held before stop of the supply of power supply voltage can be stored in a short time, and the data can be restored in a short time after the supply of power supply voltage is restarted. Thus, in the entire CPU 500 or the circuits included in the CPU 500, the supply of power supply voltage can be stopped. Accordingly, power consumption of the CPU 500 can be low.

Figure 25:
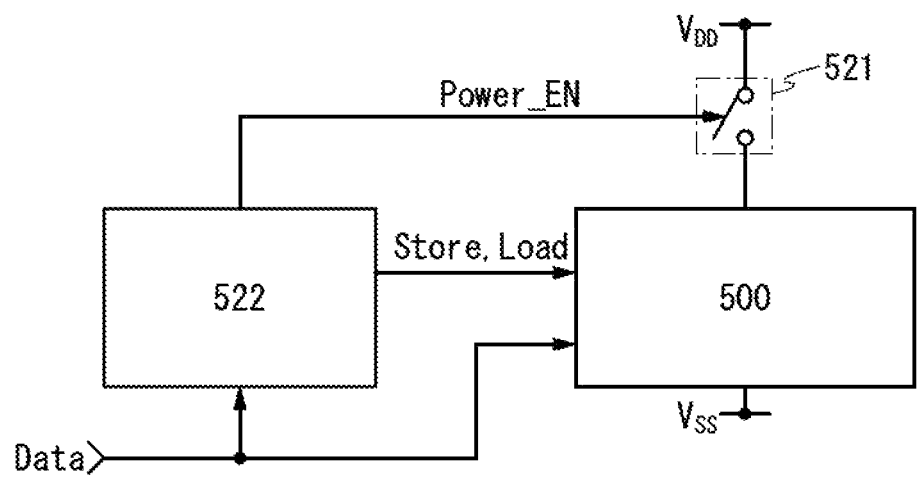
FIG. 25 is a block diagram illustrating a specific example of a semiconductor device.

FIG. 25 illustrates an example of a structure for stopping or restarting the supply of power supply voltage to the CPU 500. FIG. 25 illustrates the CPU 500, a power switch 521, and a power supply control circuit 522.

The power switch 521 can control stop or restart of the supply of power supply voltage to the CPU 500 in accordance with its on state or off state. Specifically, the power supply control circuit 522 outputs a power control signal Power_EN for turning on or off the power switch 521 to control stop or restart of the supply of power supply voltage to the CPU 500. By turning on the power switch 521, power supply voltage is supplied to the CPU 500 through wirings to which the voltages $V_{DD}$ and $V_{SS}$ are supplied. By turning off the power switch 521, a path of current between the wirings to which the voltages $V_{DD}$ and $V_{SS}$ are supplied is cut, so that the supply of power supply voltage to the CPU 500 is stopped.

The power supply control circuit 522 has a function of collectively controlling operations of the power switch 521 and the CPU 500 in accordance with the frequency of input of data Data. Specifically, the power supply control circuit 522 outputs a power control signal Power_EN for turning on or off the power switch 521 and control signals Store and Load for controlling data that is stored and restored in the semiconductor device. As described above, the control signals Store and Load enable potentials in the semiconductor device to be stored and restored between the volatile circuit and the nonvolatile circuit.

Next, an example of operations of the CPU 500, the power switch 521, and the power supply control circuit 522 illustrated in FIG. 25 will be described.

Whether the supply of power supply voltage is continued, stopped, or restarted is determined in accordance with the frequency of input of the data Data to the power supply control circuit 522. Specifically, when the data Data is continuously input to the CPU 500, the power supply control circuit 522 outputs the power control signal so that the supply of power supply voltage is continued. When the data Data is intermittently input to the CPU 500, based on timing at which the data Data is input, the power supply control circuit 522 outputs the power control signal so that the supply of power supply voltage is stopped or restarted.

The power supply control circuit 522 is preferably configured to be continuously supplied with power supply voltage even while the supply of power supply voltage to the CPU 500 is stopped. With this structure, the supply of power supply voltage to the CPU 500 can be stopped or restarted at desired timing.

Embodiment 6

The semiconductor device of one embodiment of the present invention can be used for display devices, personal computers, or image reproducing devices provided with recording media (typically, devices that reproduce the content of recording media such as digital versatile discs (DVDs) and have displays for displaying the reproduced images). Other examples of electronic devices that can be equipped with the semiconductor device of one embodiment of the present invention are mobile phones, game machines including portable game machines, portable information appliances, e-book readers, cameras such as video cameras and digital still cameras, goggle-type displays (head-mounted displays), navigation systems, audio reproducing devices (e.g., car audio systems and digital audio players), copiers, facsimiles, printers, multifunction printers, automated teller machines (ATM), and vending machines. FIGS. 26A to 26F illustrate specific examples of these electronic devices.

Figure 26A:
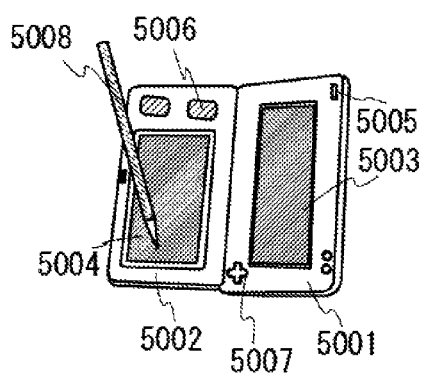
FIGS. 26A to 26F are diagrams showing electronic devices as examples.

FIG. 26A illustrates a portable game machine including a housing 5001, a housing 5002, a display portion 5003, a display portion 5004, a microphone 5005, speakers 5006, an operation key 5007, a stylus 5008, and the like. Although the portable game machine in FIG. 26A has the two display portions 5003 and 5004, the number of display portions included in the portable game machine is not limited to two.

Figure 26B:
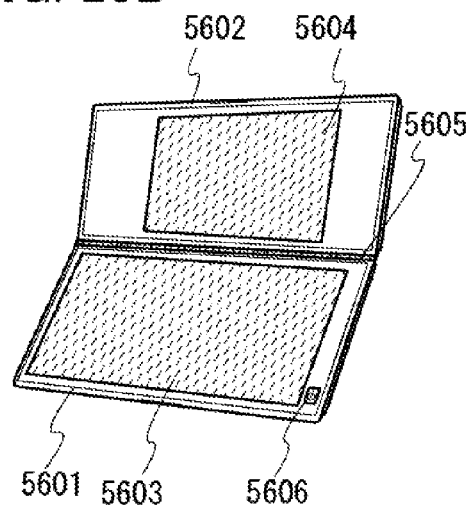

FIG. 26B illustrates a portable information appliance including a first housing 5601, a second housing 5602, a first display portion 5603, a second display portion 5604, a joint 5605, an operation key 5606, and the like. The first display portion 5603 is provided in the first housing 5601, and the second display portion 5604 is provided in the second housing 5602. The first housing 5601 and the second housing 5602 are connected to each other with the joint 5605, and the angle between the first housing 5601 and the second housing 5602 can be changed with the joint 5605. Images on the first display portion 5603 may be switched depending on the angle between the first housing 5601 and the second housing 5602 at the joint 5605. A display device with a position input function may be used as at least one of the first display portion 5603 and the second display portion 5604. Note that the position input function can be added by providing a touch panel in a display device. Alternatively, the position input function can be added by providing a photoelectric conversion element (also referred to as photosensor) in a pixel portion of a display device.

Figure 26C:
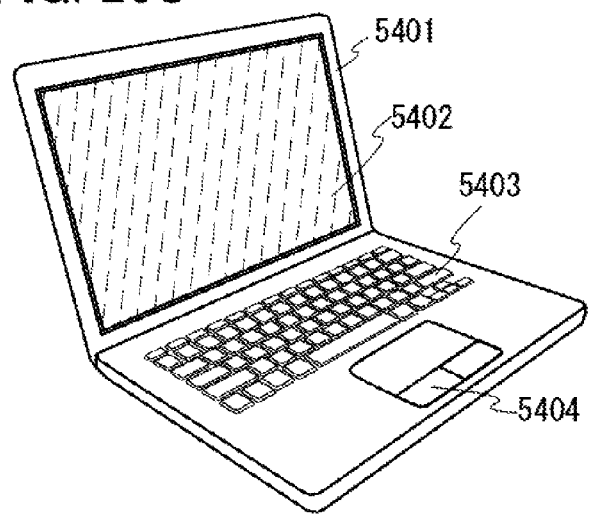

FIG. 26C illustrates a notebook personal computer including a housing 5401, a display portion 5402, a keyboard 5403, a pointing device 5404, and the like.

Figure 26D:
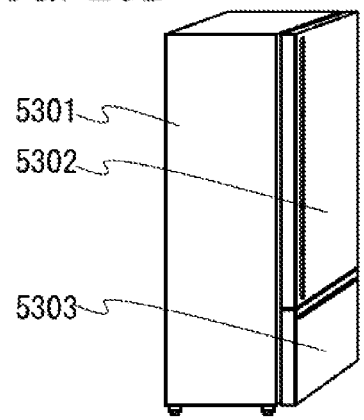

FIG. 26D illustrates an electric refrigerator-freezer including a housing 5301, a refrigerator door 5302, a freezer door 5303, and the like.

Figure 26E:
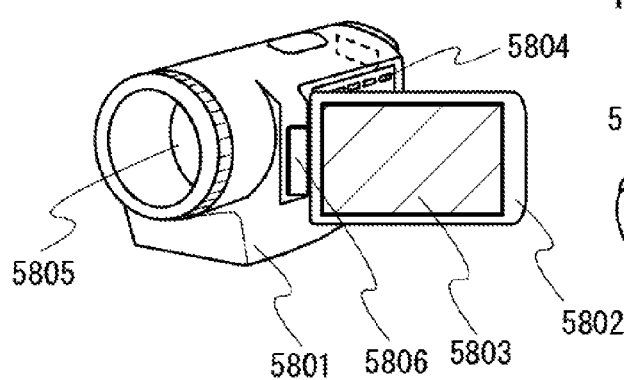

FIG. 26E illustrates a video camera including a first housing 5801, a second housing 5802, a display portion 5803, operation keys 5804, a lens 5805, a joint 5806, and the like. The operation keys 5804 and the lens 5805 are provided in the first housing 5801, and the display portion 5803 is provided in the second housing 5802. The first housing 5801 and the second housing 5802 are connected to each other with the joint 5806, and the angle between the first housing 5801 and the second housing 5802 can be changed with the joint 5806. Images on the display portion 5803 may be switched depending on the angle between the first housing 5801 and the second housing 5802 at the joint 5806.

Figure 26F:
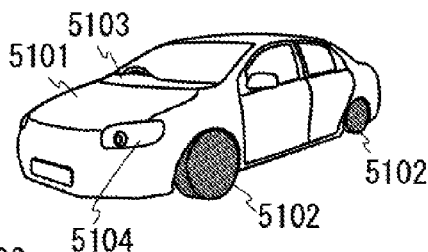

FIG. 26F illustrates a car including a car body 5101, wheels 5102, a dashboard 5103, lights 5104, and the like.

(Supplementary Notes on Description in this Specification and the Like)

The following are notes on the description of the foregoing embodiments and the structures in the embodiments.

<Notes on One Embodiment of the Present Invention Described in Embodiments>

One embodiment of the present invention can be constituted by appropriately combining the structure described in an embodiment with any of the structures described in the other embodiments. In addition, in the case where a plurality of structure examples are described in one embodiment, any of the structure examples can be combined as appropriate.

Note that a content (or part thereof) described in one embodiment can be applied to, combined with, or replaced with another content (or part thereof) described in the same embodiment and/or a content (or part thereof) described in another embodiment or other embodiments.

Note that in each embodiment, a content described in the embodiment is a content described with reference to a variety of diagrams or a content described with a text in this specification.

By combining a diagram (or part thereof) described in one embodiment with another part of the diagram, a different diagram (or part thereof) described in the embodiment, and/or a diagram (or part thereof) described in another embodiment or other embodiments, much more diagrams can be created.

<Notes on Description for Drawings>

In this specification and the like, terms for describing arrangement, such as "over," "above," "under," and "below," are used for convenience to indicate a positional relation between components with reference to drawings. The positional relation between components is changed as appropriate in accordance with a direction in which the components are described. Therefore, the terms for explaining arrangement are not limited to those used in this specification and can be changed to other terms as appropriate depending on the situation.

The term "over" or "below" does not necessarily mean that a component is placed directly on or directly below and directly in contact with another component. For example, the expression "electrode B over insulating layer A" does not necessarily mean that the electrode B is on and in direct contact with the insulating layer A and can also mean the case where another component is placed between the insulating layer A and the electrode B.

Furthermore, in a block diagram in this specification and the like, components are functionally classified and shown by blocks that are independent of each other. However, in an actual circuit and the like, it may be difficult to separate components in accordance with their functions, and there is a case where one circuit is associated with a plurality of functions or a case where a plurality of circuits are associated with one function. Therefore, the segmentation of blocks in a block diagram is not limited by any of the components described in the specification.

In the drawings, the size, the layer thickness, or the region is determined arbitrarily for description convenience; therefore, embodiments of the present invention are not limited to such a scale. Note that the drawings are schematically shown for clarity, and embodiments of the present invention are not limited to shapes or values shown in the drawings. For example, the following can be included: variation in signal, voltage, or current due to noise or difference in timing.

In drawings such as top views (also referred to as plan views or layout views) and perspective views, some of components might not be illustrated for clarity of the drawings.

<Notes on Expressions that can be Rephrased>

In this specification and the like, the terms "one of a source and a drain" (or first electrode or first terminal) and "the other of the source and the drain" (or second electrode or second terminal) are used to describe the connection relation of a transistor. This is because the source and the drain of a transistor are interchangeable depending on the structure, operation conditions, or the like of the transistor. Note that the source or the drain of the transistor can also be referred to as a source (or drain) terminal, a source (or drain) electrode, or the like as appropriate depending on the situation.

In addition, in this specification and the like, the term such as "electrode" or "wiring" does not limit a function of a component. For example, an "electrode" is used as part of a "wiring" in some cases, and vice versa. Moreover, the term "electrode" or "wiring" can also mean a plurality of electrodes or wirings formed in an integrated manner.

In this specification and the like, "voltage" and "potential" can be replaced with each other. The term "voltage" refers to a potential difference from a reference potential. Given that the reference potential is a ground potential, for example, "voltage" can be replaced with "potential." The ground potential does not necessarily mean 0 V. Potentials are relative values, and a potential supplied to a wiring or the like is sometimes changed depending on the reference potential.

In this specification and the like, the terms "film" and "layer" can be interchanged with each other depending on the case or circumstances. For example, the term "conductive layer" can be changed into the term "conductive film" in some cases. Moreover, the term "insulating film" can be changed into the term "insulating layer" in some cases.

<Notes on Definitions of Terms>

The following are definitions of the terms that are not mentioned in the above embodiments.

«Switch»

In this specification and the like, a switch is conducting or not conducting (is turned on or off) to determine whether current flows therethrough or not. Alternatively, a switch has a function of selecting and changing a current path.

For example, an electrical switch or a mechanical switch can be used. That is, any element can be used as a switch as long as it can control current, without limitation to a certain element.

Examples of an electrical switch include a transistor (e.g., a bipolar transistor and a MOS transistor), a diode (e.g., a PN diode, a PIN diode, a Schottky diode, a metal-insulator-metal (MIM) diode, a metal-insulator-semiconductor (MIS) diode, and a diode-connected transistor), and a logic circuit in which such elements are combined.

In the case of using a transistor as a switch, the "on state" of the transistor refers to a state in which a source and a drain of the transistor are regarded as being electrically short-circuited. The "off state" of the transistor refers to a state in which the source and the drain of the transistor are regarded as being electrically disconnected. In the case where a transistor operates just as a switch, there is no particular limitation on the polarity (conductivity type) of the transistor.

An example of a mechanical switch is a switch formed using a microelectromechanical system (MEMS) technology, such as a digital micromirror device (DMD). Such a switch includes an electrode that can be moved mechanically, and its conduction and non-conduction is controlled with movement of the electrode.

«Channel length»

In this specification and the like, the channel length refers to, for example, a distance between a source and a drain in a region where a semiconductor (or a portion where a current flows in a semiconductor when a transistor is on) and a gate overlap with each other or a region where a channel is formed in a top view of the transistor.

In one transistor, channel lengths in all regions are not necessarily the same. That is, the channel length of one transistor is not limited to one value in some cases. Therefore, in this specification, the channel length is any one of values, the maximum value, the minimum value, or the average value in a region where a channel is formed.

«Channel Width»

In this specification and the like, the channel width refers to, for example, the length of a portion where a source and a drain face each other in a region where a semiconductor (or a portion where a current flows in a semiconductor when a transistor is on) and a gate overlap with each other, or a region where a channel is formed.

In one transistor, channel widths in all regions are not necessarily the same. That is, the channel width of one transistor is not limited to one value in some cases. Therefore, in this specification, a channel width is any one of values, the maximum value, the minimum value, or the average value in a region where a channel is formed.

Note that in some transistor structures, a channel width in a region where a channel is actually formed (hereinafter referred to as effective channel width) is different from a channel width shown in a top view of a transistor (hereinafter referred to as apparent channel width). For example, in a transistor having a three-dimensional structure, an effective channel width is larger than an apparent channel width shown in a top view of the transistor, and its influence cannot be ignored in some cases. For example, in a miniaturized transistor having a three-dimensional structure, the proportion of a channel region formed on a side surface of a semiconductor is sometimes high. In that case, an effective channel width obtained when a channel is actually formed is larger than an apparent channel width shown in the top view.

In a transistor having a three-dimensional structure, an effective channel width is difficult to measure in some cases. For example, estimation of an effective channel width from a design value requires an assumption that the shape of a semiconductor is known. Thus, in the case where the shape of a semiconductor is not known accurately, it is difficult to measure an effective channel width accurately.

In view of this, in this specification, an apparent channel width, which is the length of a portion where a source and a drain face each other in a region where a semiconductor and a gate overlap with each other in a top view of a transistor, is sometimes referred to as a surrounded channel width (SCW). Furthermore, in this specification, the term "channel width" may denote a surrounded channel width or an apparent channel width, or may denote an effective channel width. Note that the values of a channel length, a channel width, an effective channel width, an apparent channel width, a surrounded channel width, and the like can be determined by obtaining and analyzing a cross-sectional TEM image and the like.

In the case where field-effect mobility, a current value per channel width, and the like of a transistor are obtained by calculation, a surrounded channel width may be used for the calculation. In that case, a value different from one when an effective channel width is used for the calculation is obtained in some cases.

«Connection»

In this specification and the like, the expression "A and B are connected" or "A is connected to B" means the case where A and B are electrically connected to each other as well as the case where A and B are directly connected to each other. Here, the expression "A and B are electrically connected" means the case where electric signals can be transmitted and received between A and B when an object having any electric action exists between A and B.

This application is based on Japanese Patent Application Serial No. 2016-202007 filed with Japan Patent Office on Oct. 13, 2016, the entire contents of which are hereby incorporated by reference.

What is claimed is:

1. A decoder configured to decode data, the decoder comprising:
   a semiconductor device comprising:
     a first circuit; and
     a second circuit comprising:
       a first transistor;
       a second transistor, a gate of the second transistor is electrically connected to one of a source and a drain of the first transistor; and
       a third transistor, a gate of the third transistor is electrically connected to one of a source and a drain of the second transistor,
   wherein the first circuit is configured to hold data while power supply voltage is supplied,
   wherein the second circuit is configured to hold the data while power supply voltage is not supplied,
   wherein the first transistor and the second transistor comprise an oxide semiconductor in a channel formation region,
   wherein the third transistor comprises silicon in a channel formation region,
   wherein the decoder is configured to provide and stop power supply to the semiconductor device depending on an identifier of a header portion of the data, and
   wherein the decoder is configured to perform data storing and restoring of data between the first circuit and the second circuit.

2. The decoder according to claim 1,
   wherein the data is transmitted to the decoder in packets comprising a data structure of a transport stream.

3. A receiver configured to receive a broadcast signal, the receiver comprising:
   a demodulator; and
   the decoder according to claim 1,
   wherein the demodulator is configured to demodulate the broadcast signal, and
   wherein the decoder processes the demodulated broadcast signal.

4. An electronic device comprising a display portion and the receiver according to claim 3.

5. A decoder configured to decode data, the decoder comprising:
   a semiconductor device comprising:

a first circuit; and
a second circuit comprising:
  a first transistor;
  a second transistor, a gate of the second transistor is electrically connected to one of a source and a drain of the first transistor; and
  a third transistor, a gate of the third transistor is electrically connected to one of a source and a drain of the second transistor,
wherein the first circuit is configured to hold data while power supply voltage is supplied,
wherein the second circuit is configured to hold the data while power supply voltage is not supplied,
wherein the first transistor and the second transistor comprise an oxide semiconductor in a channel formation region,
wherein the third transistor comprises silicon in a channel formation region,
wherein the decoder is configured to provide and stop power supply to the semiconductor device depending on whether a packet of the data is a null packet or not, and
wherein the decoder is configured to perform data storing and restoring of data between the first circuit and the second circuit.

6. The decoder according to claim 5,
wherein the data is transmitted to the decoder in packets comprising a data structure of a transport stream.

7. A receiver configured to receive a broadcast signal, the receiver comprising:
a demodulator; and
the decoder according to claim 5,
wherein the demodulator is configured to demodulate the broadcast signal, and
wherein the decoder processes the demodulated broadcast signal.

8. An electronic device comprising a display portion and the receiver according to claim 7.

9. A decoder configured to decode data, the decoder comprising:
a semiconductor device comprising:
  a first circuit configured to hold data while power supply voltage is supplied; and
  a second circuit configured to hold the data while power supply voltage is not supplied,
wherein the first circuit comprises a transistor comprising an oxide semiconductor in a channel formation region,
wherein the decoder is configured to provide and stop power supply to the semiconductor device depending on an identifier of a header portion of the data, and
wherein the decoder is configured to perform data storing and restoring of data between the first circuit and the second circuit.

10. The decoder according to claim 9,
wherein the data is transmitted to the decoder in packets comprising a data structure of a transport stream.

11. A receiver configured to receive a broadcast signal, the receiver comprising:
a demodulator; and
the decoder according to claim 9,
wherein the demodulator is configured to demodulate the broadcast signal, and
wherein the decoder processes the demodulated broadcast signal.

12. An electronic device comprising a display portion and the receiver according to claim 11.

\* \* \* \* \*